US012663312B2

(12) United States Patent
Lawrence

(10) Patent No.: US 12,663,312 B2
(45) Date of Patent: Jun. 23, 2026

(54) PIXEL SCALE Fabry Perot FILTER ARRAY FOR CHEMICAL AGENT VAPOR DETECTION

(71) Applicant: Massachusetts Institute of Technology, Cambridge, MA (US)

(72) Inventor: William Lawrence, Medford, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 343 days.

(21) Appl. No.: 18/159,385

(22) Filed: Jan. 25, 2023

(65) Prior Publication Data

US 2024/0167874 A1 May 23, 2024

Related U.S. Application Data

(60) Provisional application No. 63/324,561, filed on Mar. 28, 2022.

(51) Int. Cl.
*G01J 3/28* (2006.01)
*G01J 3/02* (2006.01)
(Continued)

(52) U.S. Cl.
CPC ........... *G01J 3/2803* (2013.01); *G01J 3/0205* (2013.01); *G01J 3/0208* (2013.01); *G01J 3/021* (2013.01);
(Continued)

(58) Field of Classification Search
CPC ...... G01J 3/2803; G01J 3/0205; G01J 3/0208; G01J 3/021; G01J 3/0256; G01J 3/0259;

G01J 3/0291; G01J 3/26; G01J 3/0264; G01J 2003/2806; G02B 5/28; G02B 5/284; G02B 5/281; G03F 7/0007;
(Continued)

(56) References Cited

U.S. PATENT DOCUMENTS

| | | | |
|---|---|---|---|
| 6,985,233 B2 * | 1/2006 | Tuschel | G01J 3/44 356/454 |
| 7,202,955 B2 * | 4/2007 | Te Kolste | G01J 3/26 356/454 |

(Continued)

FOREIGN PATENT DOCUMENTS

| | | | | |
|---|---|---|---|---|
| CN | 112229515 A * | 1/2021 | ........... | G01J 3/0259 |
| CN | 112834036 A * | 5/2021 | ........... | G01J 3/2803 |
| KR | 20220011072 A * | 6/2021 | ........... | G01J 3/26 |

OTHER PUBLICATIONS

Minas, Graca, et al. "An array of Fabry-Perot optical-channels for biological fluids analysis." Sensors and Actuators A: Physical 115.2-3 (2004): 362-367. (Year: 2004).*
(Continued)

*Primary Examiner* — Michelle M Iacoletti
*Assistant Examiner* — Noah J. Haney
(74) *Attorney, Agent, or Firm* — Smith Baluch LLP

(57) ABSTRACT

Fabry-Pèrot filters having different cavity thicknesses are formed in arrays on a substrate for spectral sensing. The filter array can be coupled to a detector array to make a compact, low size, weight and power spectral sensor that detects spectral information in a scene viewed by the detector array. The spectral sensor can be used in a compact spectrometer to detect the presence of harmful chemical vapors.

15 Claims, 27 Drawing Sheets

(51) Int. Cl.

| | |
|---|---|
| *G01J 3/26* | (2006.01) |
| *G01N 21/17* | (2006.01) |
| *G02B 5/28* | (2006.01) |
| *G03F 7/00* | (2006.01) |
| *H01S 3/08022* | (2023.01) |

(52) U.S. Cl.
CPC ........... *G01J 3/0256* (2013.01); *G01J 3/0259* (2013.01); *G01J 3/0291* (2013.01); *G01J 3/26* (2013.01); *G02B 5/28* (2013.01); *G02B 5/284* (2013.01); *G03F 7/0007* (2013.01); *G01J 3/0264* (2013.01); *G01J 2003/2806* (2013.01); *G01N 2021/1793* (2013.01); *G01N 2201/0214* (2013.01); *G01N 2201/0216* (2013.01); *G02B 5/281* (2013.01); *H01S 3/08027* (2013.01)

(58) Field of Classification Search
CPC ........ H01S 3/08027; G01N 2021/1793; G01N 2201/0214; G01N 2201/0216
USPC .......................................................... 356/326
See application file for complete search history.

(56) References Cited

U.S. PATENT DOCUMENTS

| | | | | |
|---|---|---|---|---|
| 8,274,739 | B2 * | 9/2012 | Lee ...................... | G02B 6/1226 |
| | | | | 359/590 |
| 10,260,945 | B2 * | 4/2019 | Tack ..................... | G01J 3/2803 |
| 2008/0042782 | A1 * | 2/2008 | Wang ....................... | G02B 5/28 |
| | | | | 333/195 |

| | | | | |
|---|---|---|---|---|
| 2011/0299104 | A1 * | 12/2011 | Seo ......................... | G01J 3/513 |
| | | | | 358/1.9 |
| 2013/0275052 | A1 * | 10/2013 | Loder .................... | G01N 21/59 |
| | | | | 702/24 |
| 2014/0327099 | A1 * | 11/2014 | Boudreau ............... | H10F 39/80 |
| | | | | 257/432 |
| 2015/0276478 | A1 * | 10/2015 | Geelen ................... | G02B 5/201 |
| | | | | 356/454 |
| 2018/0170093 | A1 * | 6/2018 | Najiminaini ........... | B42D 25/29 |
| 2019/0056269 | A1 * | 2/2019 | Liu ........................... | G01J 3/28 |
| 2019/0369259 | A1 * | 12/2019 | Fourguette ............. | G01S 17/58 |
| 2020/0049555 | A1 * | 2/2020 | Goldring ............... | G01J 3/0291 |
| 2020/0109991 | A1 * | 4/2020 | Tack ......................... | G01J 3/26 |
| 2020/0319027 | A1 * | 10/2020 | Fox ......................... | G01J 3/513 |
| 2021/0018664 | A1 * | 1/2021 | Houck ................... | G02B 5/281 |
| 2021/0231889 | A1 * | 7/2021 | Heussler ............. | G03F 7/70466 |
| 2021/0372853 | A1 * | 12/2021 | Borremans ........... | G01J 3/2823 |
| 2022/0128408 | A1 * | 4/2022 | Fiore ........................ | G01J 3/021 |
| 2023/0113897 | A1 * | 4/2023 | Deliwala ............. | G01N 21/255 |
| | | | | 356/317 |

OTHER PUBLICATIONS

Chang et al. "Hyperspectral Fabry-Perot filters for HgCdTe infrared detectors." Advanced Fabrication Technologies for Micro/Nano Optics and Photonics VI. vol. 8613. SPIE, 2013, 10 pages.

Smith et al., "Design, simulation, and fabrication of three-dimensional microsystem components using grayscale photolithography," Journal of Micro/Nanolithography, MEMS, and MOEMS 18.4 (2019): 043507, 15 pages.

* cited by examiner

P725 LW181 (25%)

P725 LW562 (78%)

SEM Images

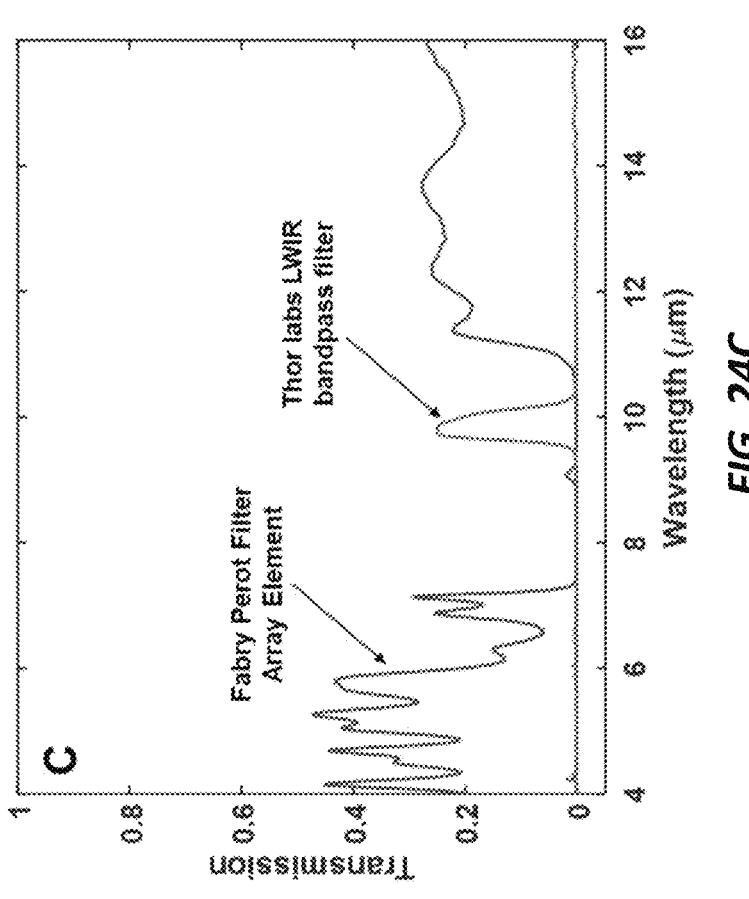
*FIG. 24C*
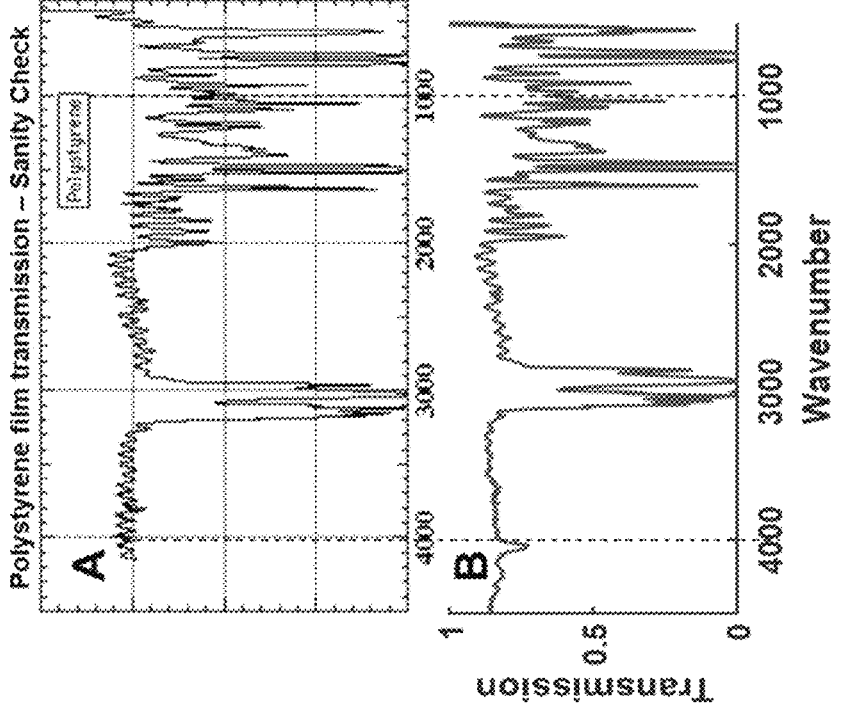
*FIG. 24A*
*FIG. 24B*

1

PIXEL SCALE Fabry Perot FILTER ARRAY FOR CHEMICAL AGENT VAPOR DETECTION

CROSS-REFERENCE TO RELATED APPLICATION(S)

This application claims the priority benefit, under 35 U.S.C. 119(e), of U.S. Application No. 63/324,561 titled, "Pixel Scale Fabry-Pèrot Filters for Hyperspectral Standoff Chemical Agent Detection," filed Mar. 28, 2022, which is incorporated by reference herein in its entirety for all purposes.

GOVERNMENT SUPPORT

This invention was made with government support under FA8702-15-D-0001 awarded by the U.S. Air Force. The government has certain rights in the invention.

BACKGROUND

Passive long wave infrared (LWIR) standoff sensing of chemical warfare agents (CWAs) is a desired capability for the chemical defense infrastructure of the U.S. military. This sensing technique uses the infrared absorption signatures of chemical warfare agents over the 8-micron to 12-micron spectral range to identify threat plumes. Several standoff detection systems are based on Fourier transform infrared (FTIR) spectrometers. In one example standoff detection system, the field-of-view of a single Peltier cooled LWIR detector passes through a Michelson interferometer and scans over the field of regard.

The application space for these instruments is limited by the size, weight, and power (SWAP) of the instruments. Some of these systems weigh 56-85 pounds and cost hundreds of thousands of dollars. The SWAP requirements limit the use of the sensor to fixed sites or deployment on large mobile platforms, such as trucks or combat vehicles.

SUMMARY

The present disclosure describes a low-SWAP, low-cost, standoff chip-based spectral sensor that can be used for an integrated, compact spectrometer. The sensor is designed to detect trace gasses or other chemicals in the field-of-view of the sensor or in liquid sampled by the sensor. The sensor is created by directly coupling an array of fixed-frequency Fabry-Pèrot filters to a longwave infrared (LWIR) detector array where different elements of the filter array are tuned to pass different wavelength bands to corresponding detector or detectors in the detector array. The sensor can obtain a spectrally-resolved snapshot of emissions incident on the Fabry-Pèrot filters that come from a field-of-view of the sensor. The spectrally-resolved snapshot of the field-of-view can be obtained instantaneously (e.g., in a single data acquisition step of the detector array).

Some implementations relate to a spectral sensor comprising a first substrate and an array of optical filters formed on the first substrate. Each optical filter can have a first mirror formed on the first substrate, a second mirror spaced apart from the first mirror and in optical communication with the first mirror, and an etalon formed between the first mirror and the second mirror. The spectral sensor can further include a second substrate and an array of detectors formed on the second substrate. The array of detectors can be in optical communication with the array of optical filters. Further, the array of optical filters includes at least 10 optical filters for which the etalons of the 10 optical filters have different thicknesses such that the 10 optical filters have different transmission functions or different reflectivity functions. The etalons of the 10 optical filters having the different thicknesses can all be etched from a same layer of material on the first substrate.

Some implementations relate to a method of making a spectral sensor. The method can include acts of illuminating a grayscale photomask to expose a photoresist and pattern an array of etalons for Fabry-Pèrot filters, wherein the photoresist is deposited over an etalon layer on a substrate; developing the photoresist such that the photoresist has at least 10 different thicknesses over the etalon layer; and etching the photoresist and at least a portion of the etalon layer to pattern the array of etalons, wherein the array of etalons includes at least 10 etalons having different thicknesses.

All combinations of the foregoing concepts and additional concepts discussed in greater detail below (provided such concepts are not mutually inconsistent) are part of the inventive subject matter disclosed herein. In particular, all combinations of subject matter appearing in this disclosure are part of the inventive subject matter disclosed herein. The terminology used herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally and/or structurally similar elements).

Figure 9:
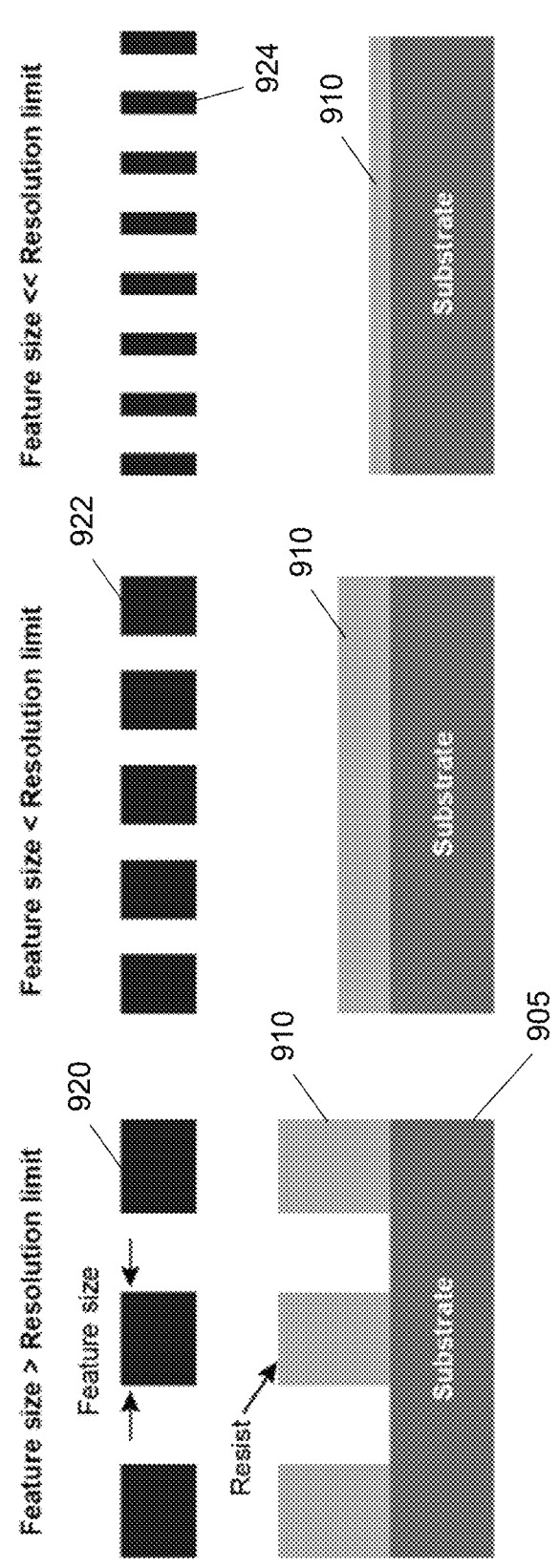

FIG. 9 illustrates the impact of feature size in the photomask and the resist profile as a function of the ratio of feature size to resolution limit. From Smith et al., J. Micro/Nano MEMS MOEMS 18(4) 043507 (2019), which is incorporated herein by reference in its entirety.

FIG. 10A, FIG. 10B, FIG. 10C, and FIG. 10D depict structures formed in a grayscale photolithography process.

Figures 11A, 11B, 11C:
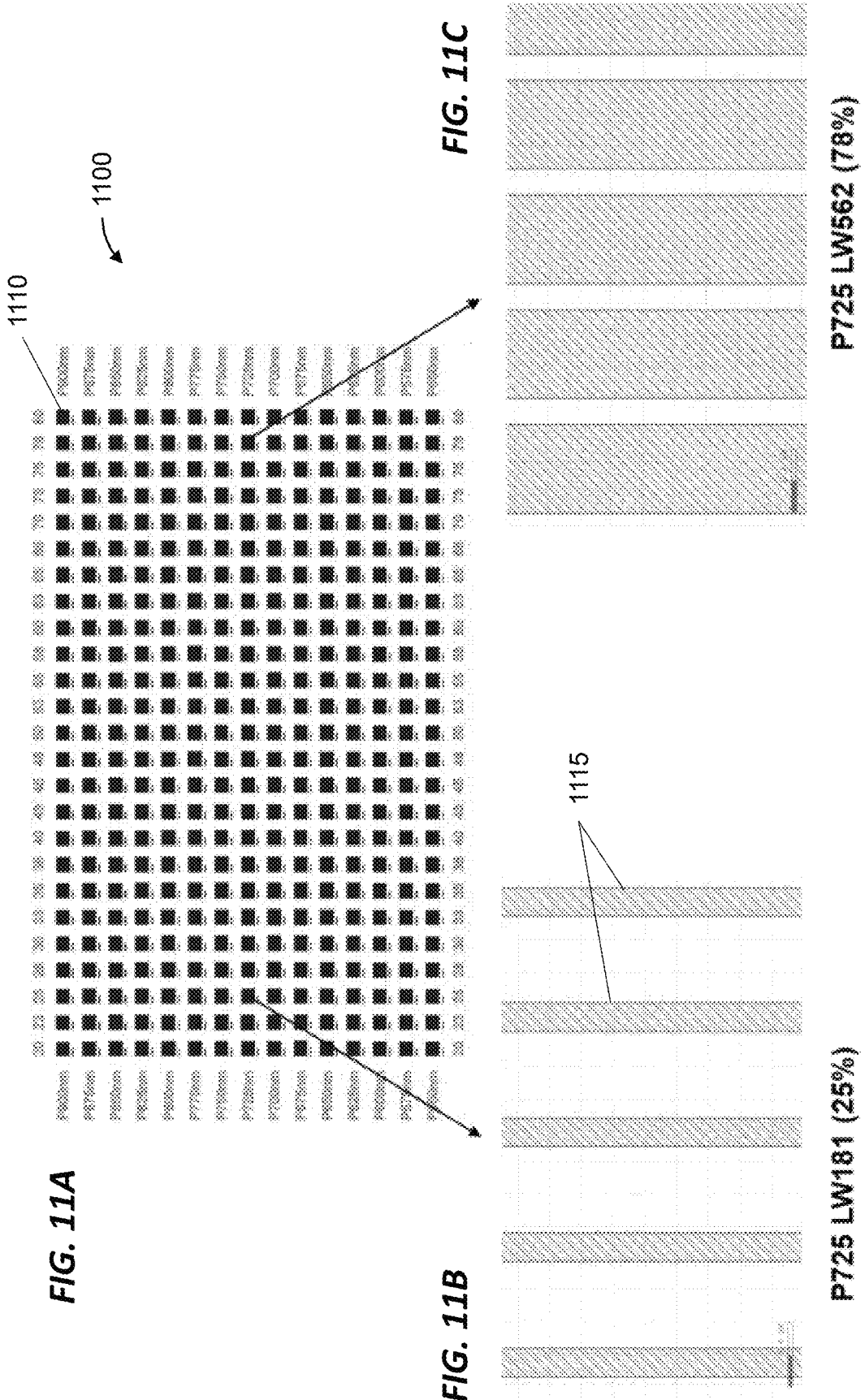

FIG. 11A, FIG. 11B, and FIG. 11C show the mask layout of a grayscale photolithography mask. FIG. 11A: Test block from the mask which is a matrix of pitch (along vertical axis) and fill factor (along the horizontal axis). FIG. 11B and FIG. 11C are detail examples of different fill factors at the same pitch.

Figure 12:
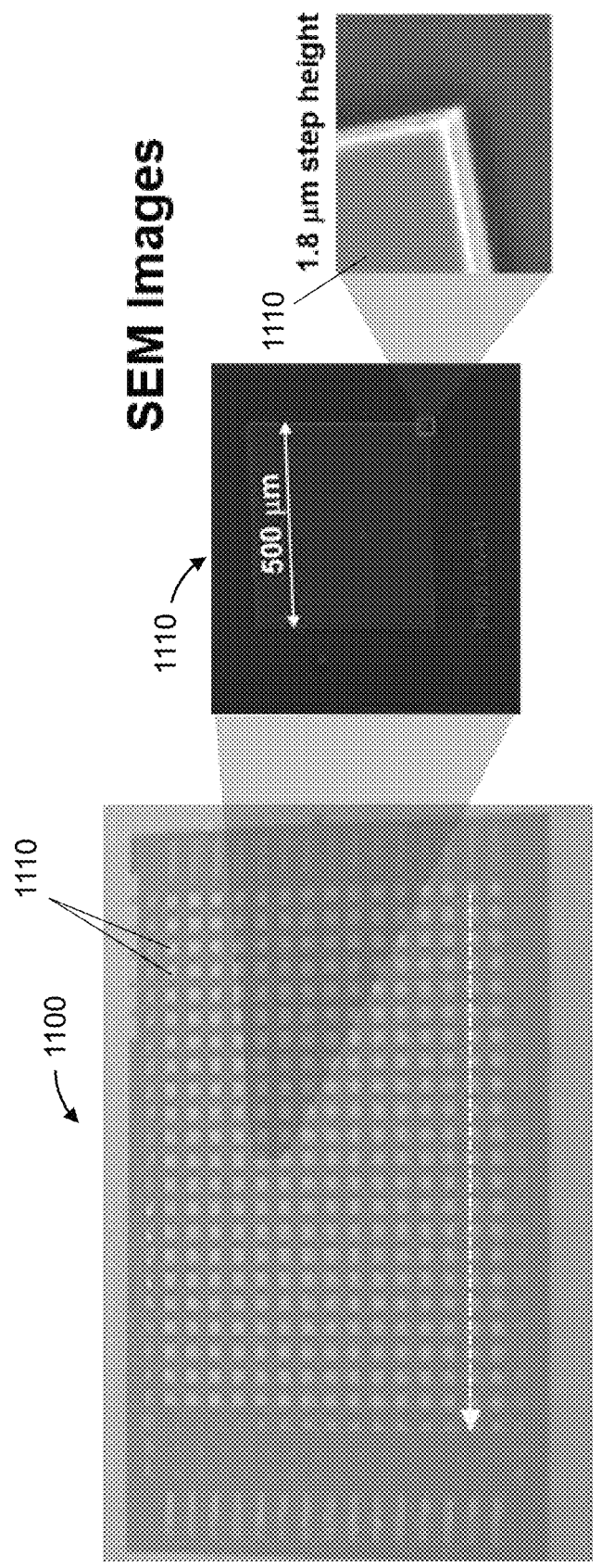

FIG. 12 shows a visible image (left) of the etched germanium features on the silicon wafer using the test block in the mask of FIG. 11A. Scanning electron microscope (SEM) images (right) show the step height and uniform top surface of the germanium features.

Figure 13:
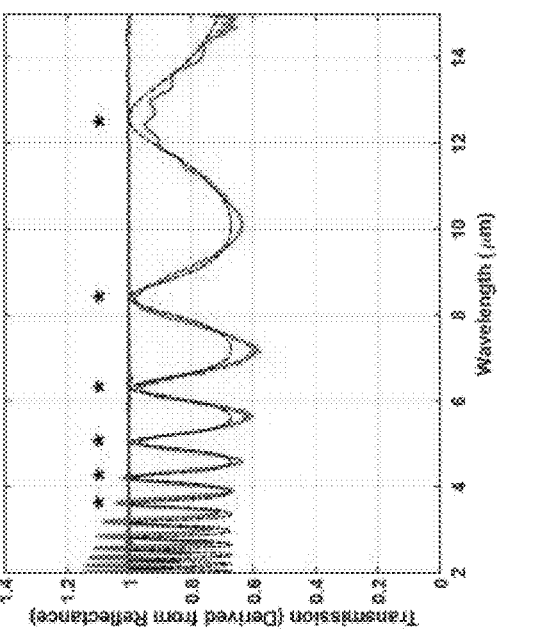

FIG. 13 is a plot of calculated transmission (obtained by subtracting the measured reflectance from 1) for a germanium etalon produced from a 575-nm-pitch, 480-nm-linespace grayscale mask. The "transmission" maxima are marked with asterisks and the dashed line is the fit of the data using EQ. 1 with 0.11 for mirror reflectivity and 3.15-micron thick germanium.

Figure 14:
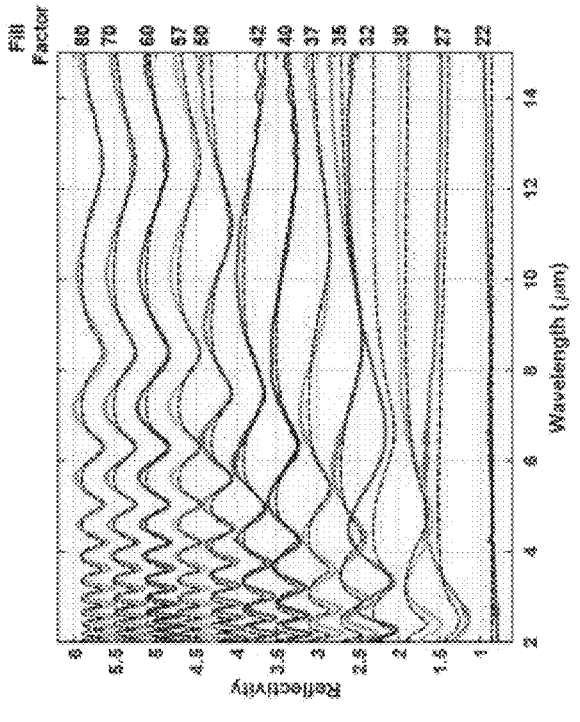

FIG. 14 is a plot of measured reflectance of germanium features from the test matrix at different fill factors (as indicated on the right of the graph). Spectra are offset vertically for clarity.

Figure 15:
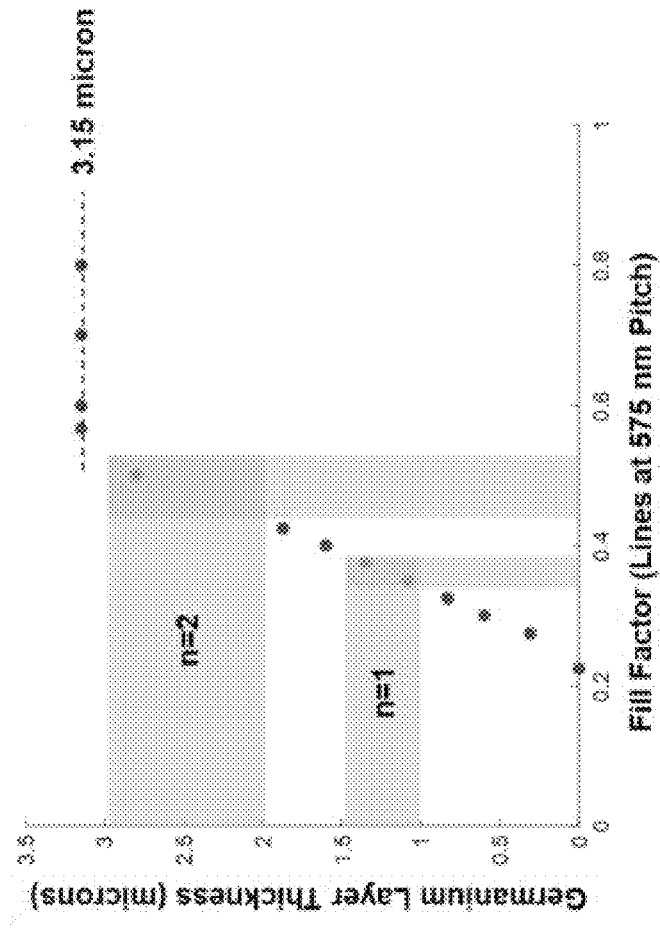

FIG. 15 is a plot of the thickness measurement of germanium feature based on FTIR reflectance measurements in FIG. 14. The shaded areas indicate the working range for the LWIR germanium layer thickness for first- and second-order Fabry-Pèrot transmission peaks.

Figures 16A, 16B, 17:
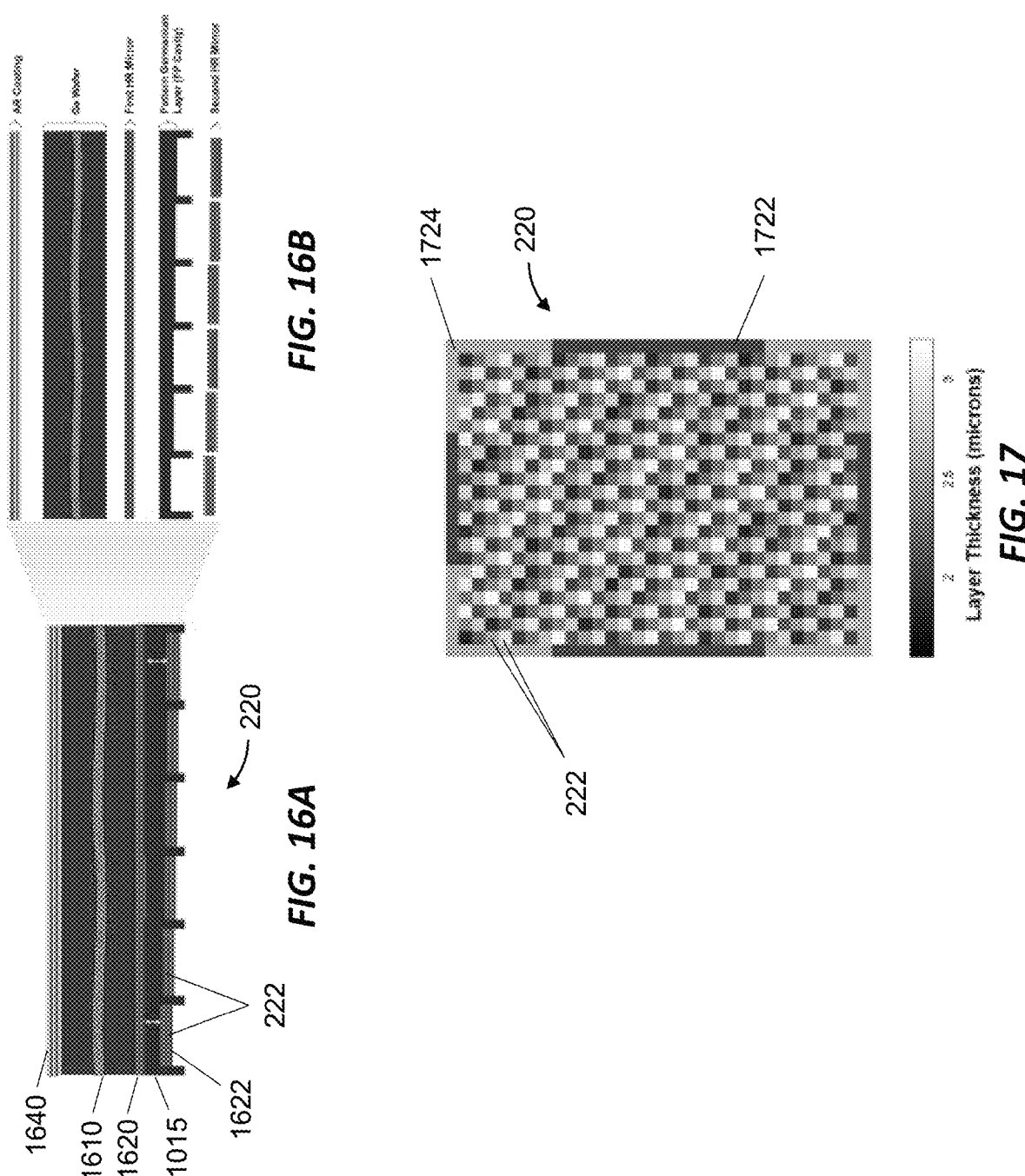

FIG. 16A and FIG. 16B show a Fabry-Pèrot Filter array (A) and an exploded view (B) of the components of the Fabry-Pèrot filter array (not to scale).

FIG. 17 shows a layout of the mask that will define the cavity thickness in the Fabry-Pèrot filter. There are 132 gray scale values. Each value is repeated 5 times in a pseudo random spatial pattern across the array.

Figure 18:
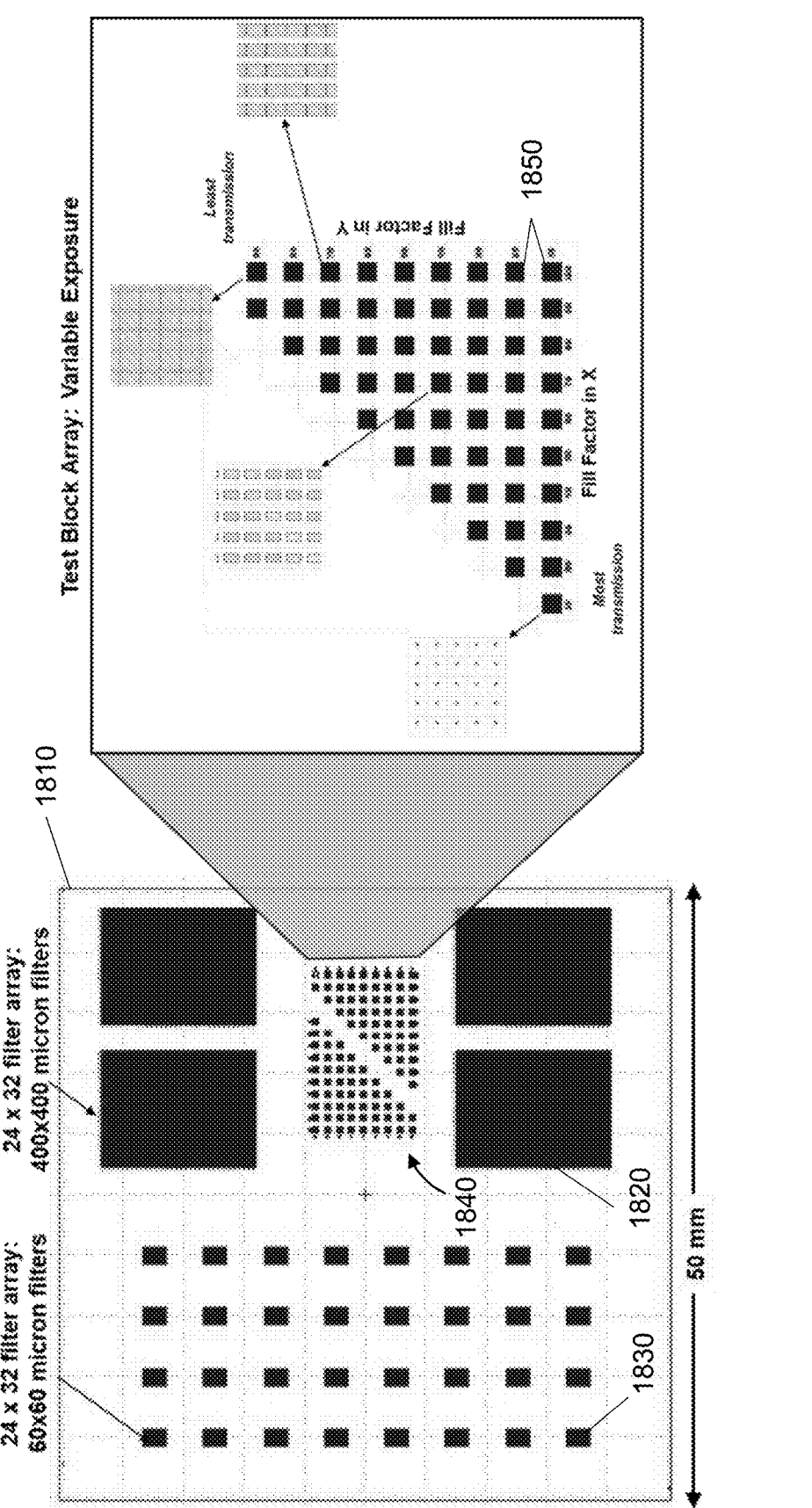

FIG. 18 shows a die layout for the 50×50 mm exposure field of a Canon i-line stepper.

Figure 19:
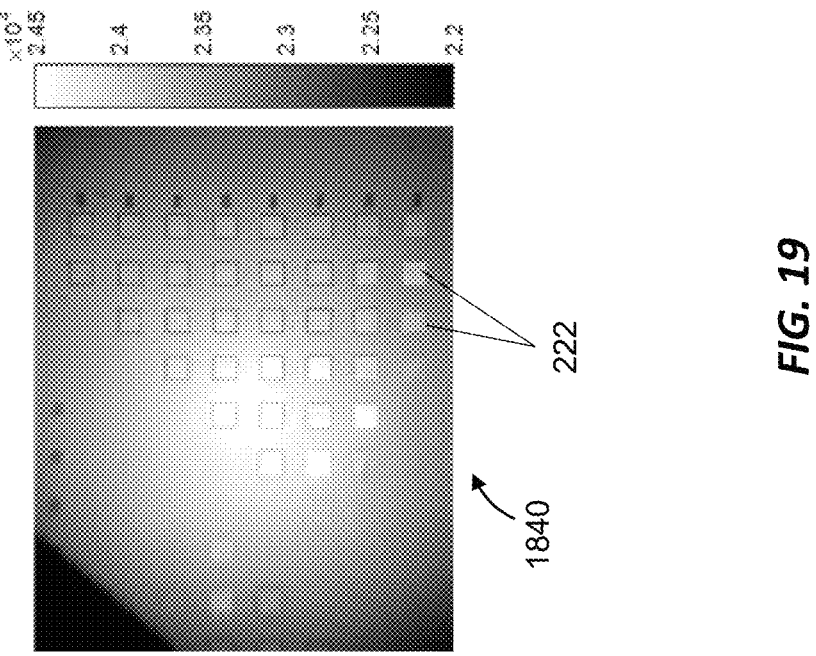

FIG. 19 is an image of a test block array (produced from the die and mask of FIG. 18) recorded using the FUR Boson camera with a Globar blackbody source behind the filter array.

Figures 20A, 20B, 20C:
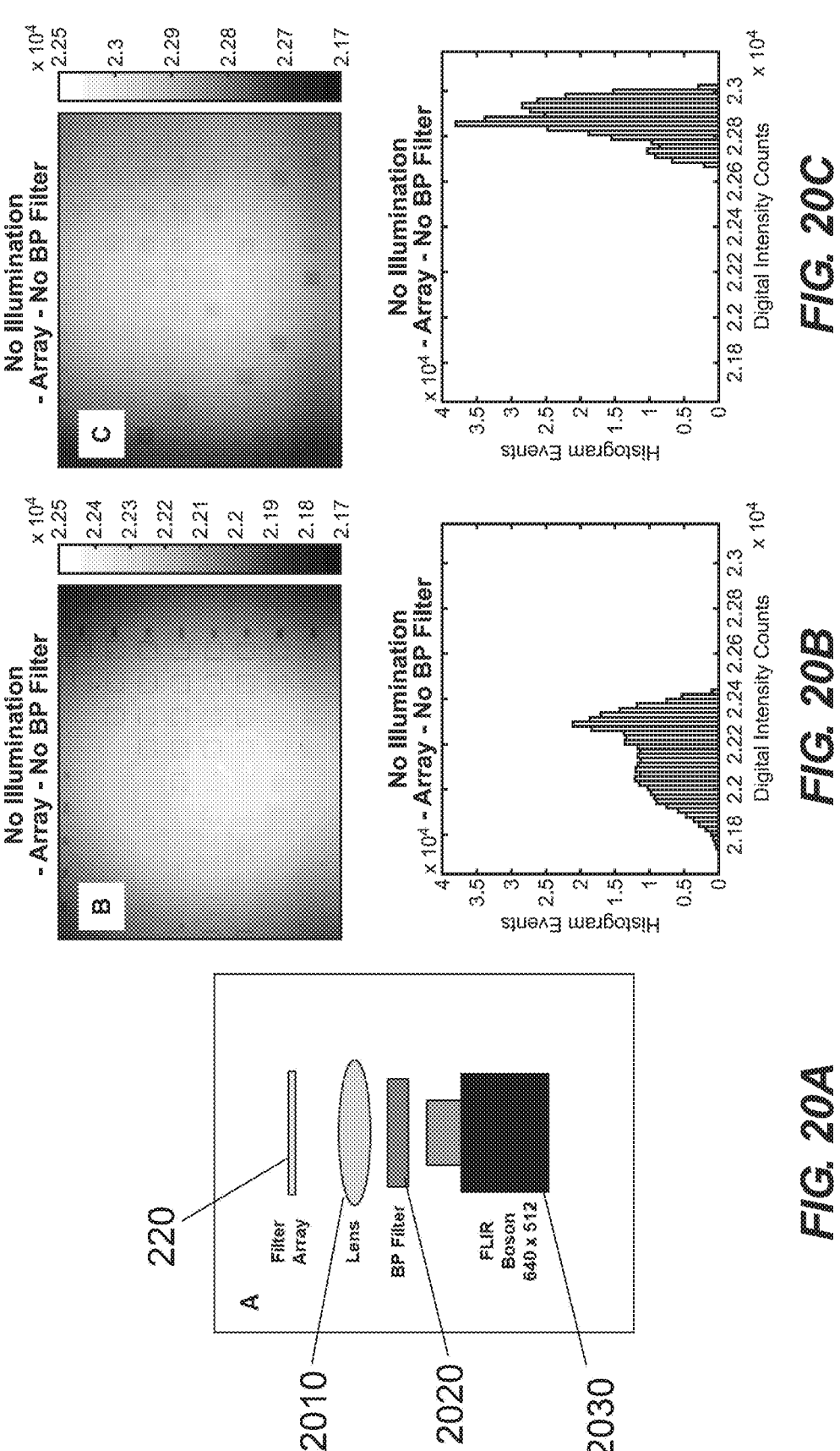

FIG. 20A shows optics for recording images with a FLTR Boson camera.

FIG. 20B shows an image (top) and histogram (bottom) of the array of FIG. 19 with no bandpass filter.

FIG. 20C shows an image (top) and histogram (bottom) of the array of FIG. 19 with the bandpass filter.

Figures 21A, 21B:
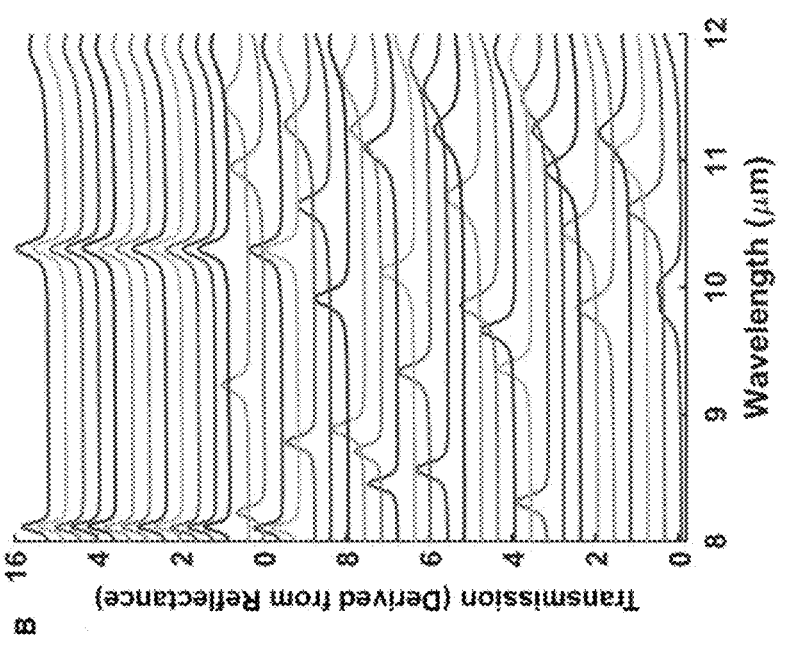

FIG. 21A and FIG. 21B illustrate the dependence of filter spectrum as a function of relative exposure intensity. FIG. 21A: Matrix of relative exposure intensity as a function of x and y fill factor. Shading on the bottom rows indicates overexposure and no remaining germanium, shading on the middle rows indicates within the exposure window with variation in germanium step height, and shading in the upper rows indicates underexposure with no change in germanium step height. FIG. 21B: Spectra of the upper- and middle-row filter locations—all of the filters in the upper rows have similar spectra.

Figure 22B:
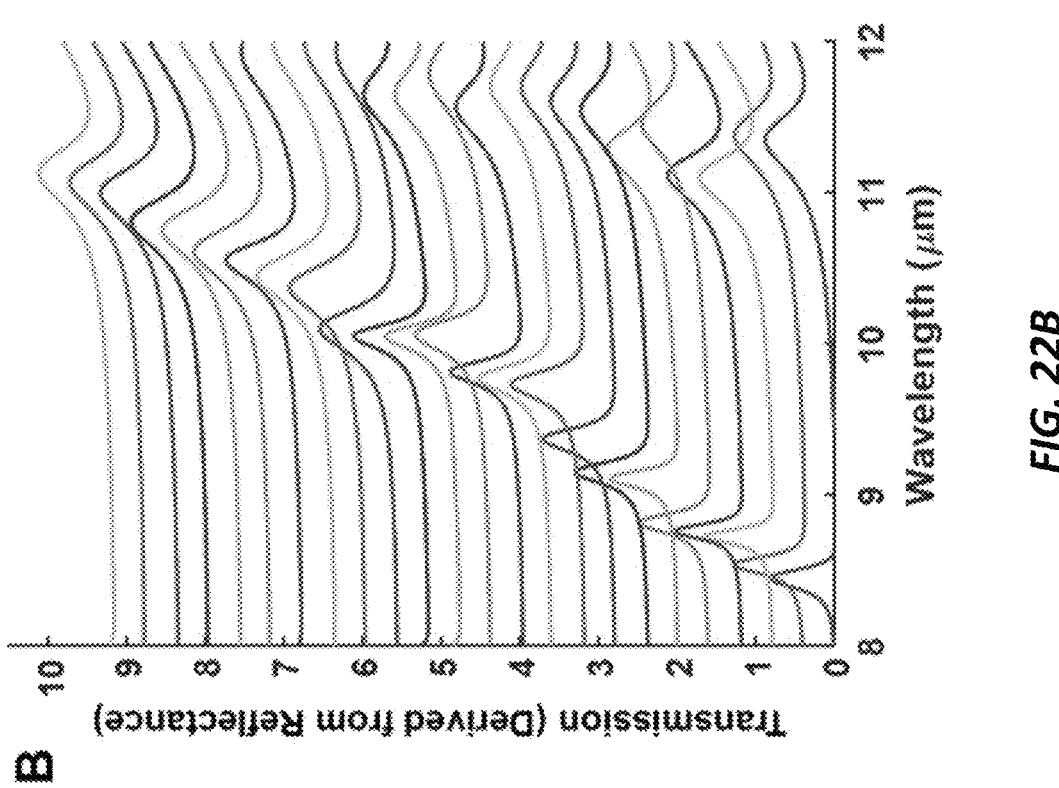
Figure 22A:
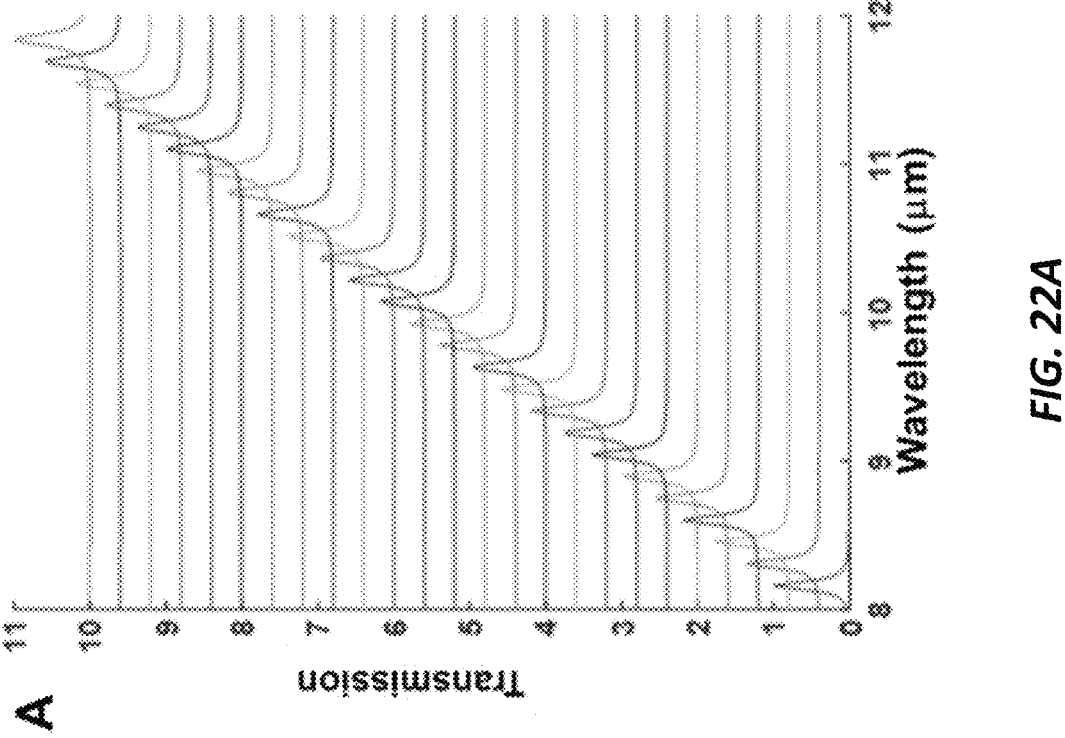

FIG. 22A and FIG. 22B illustrate objective versus measured filer performance. FIG. 22A: objective (idealized) filter performance depicted in FIG. 3. FIG. 22B: Measured reflectance cast as transmission (transmission=1−reflectance) for the filter test block.

Figure 23:
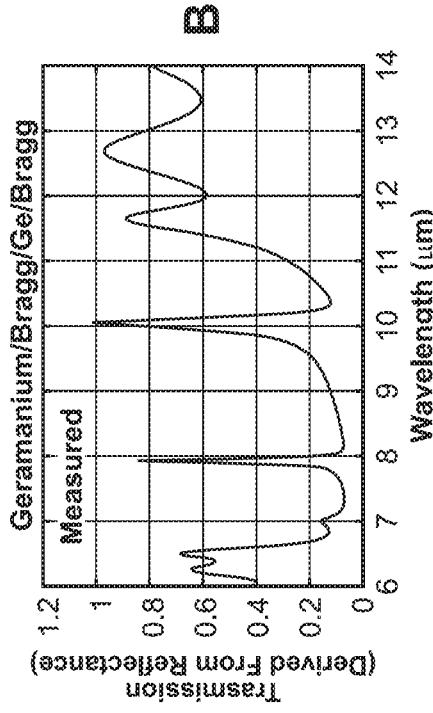
Figure 23:
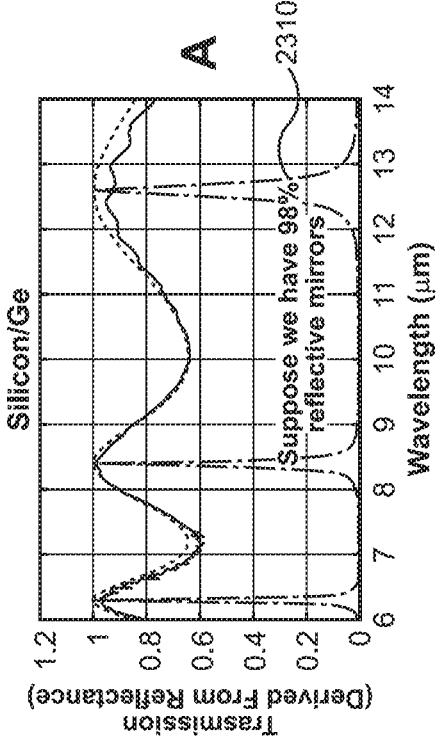
Figure 23:
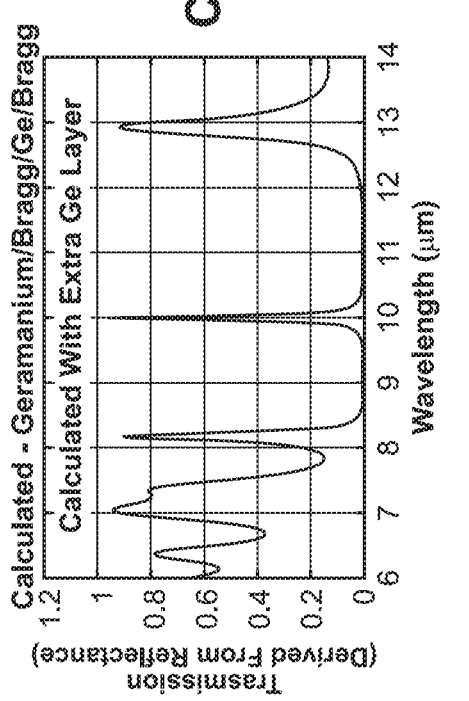

FIG. 23 shows reflectance measurements cast as transmission for different system.

FIG. 24A, FIG. 24B, and FIG. 24C illustrate initial transmission measurements using the FTIR microscope. FIG. 24A: Literature spectrum of a polystyrene film. FIG. 24B: Measured spectrum of polystyrene film. FIG. 24C: Transmission measurement of a Fabry-Pèrot filter element and the Thor Labs bandpass filter (10-micron center wavelength–0.5-micron full width half maximum).

Figure 25:
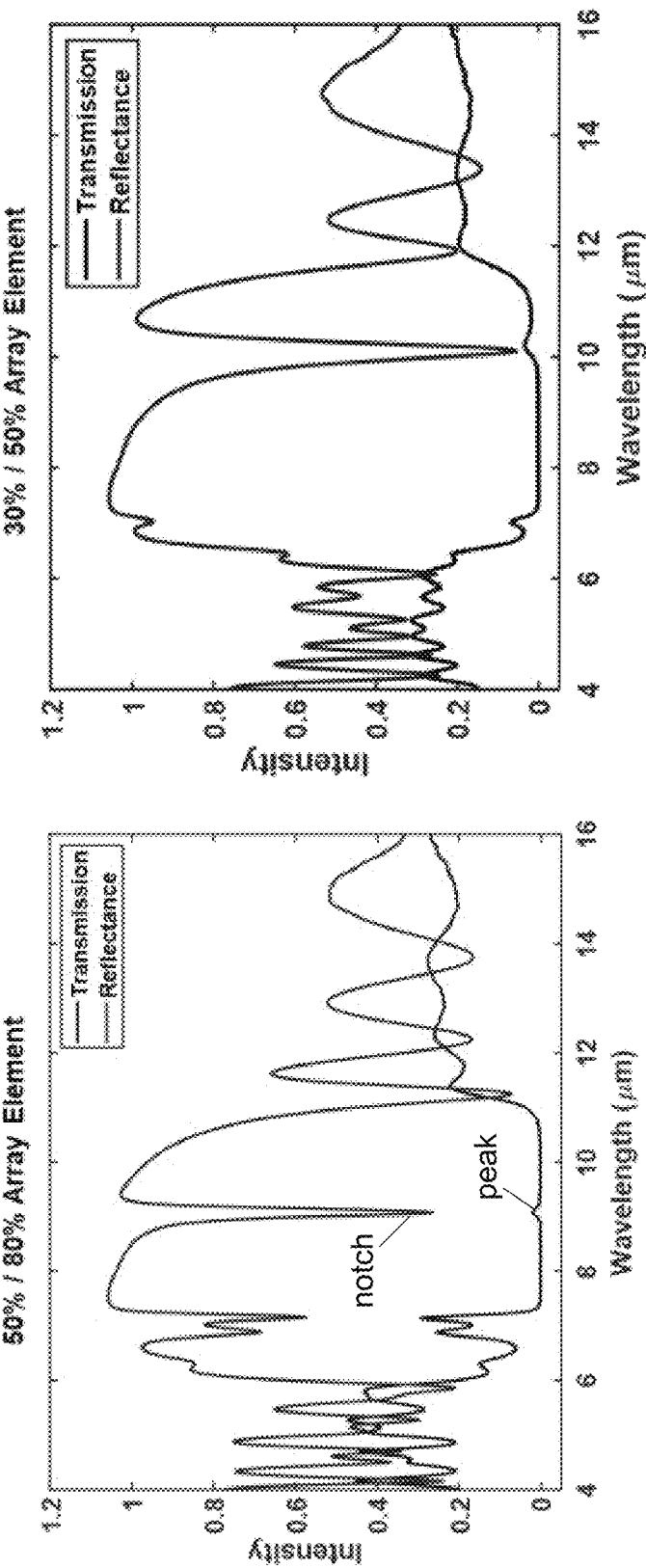

FIG. 25 shows a comparison of reflectance and transmission measurements for two different elements in the test block.

Figure 26:
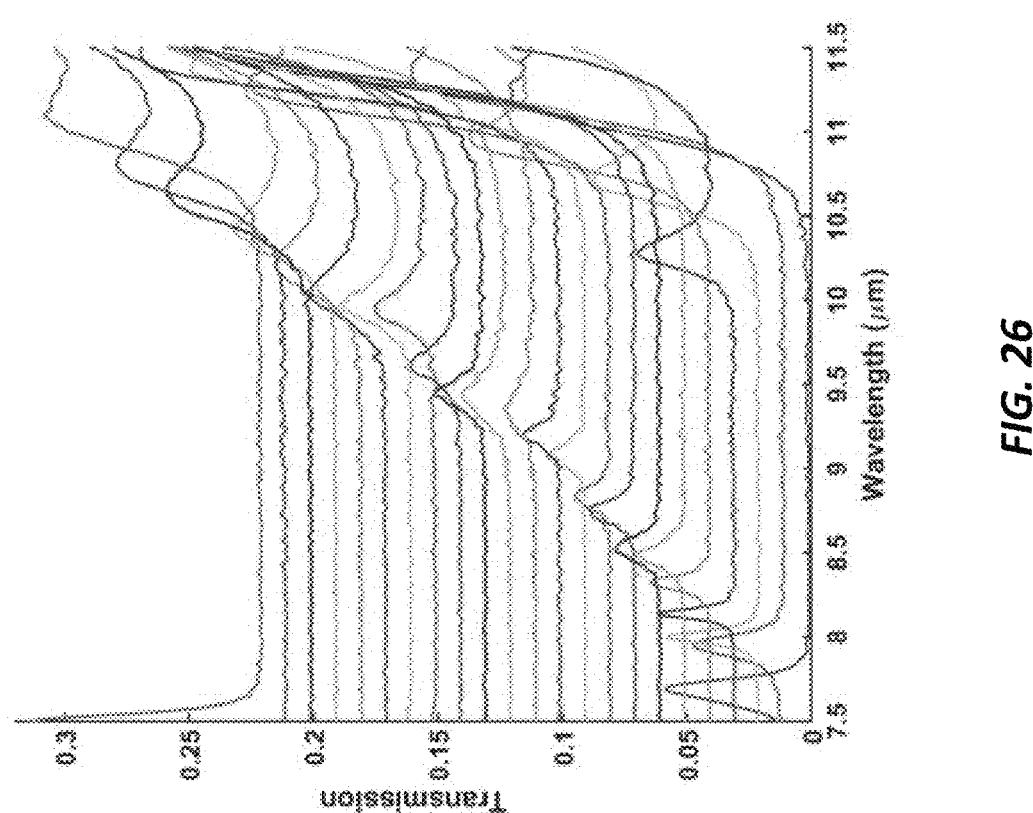

FIG. 26 shows the measured transmission of the test block filter array.

Figure 27:
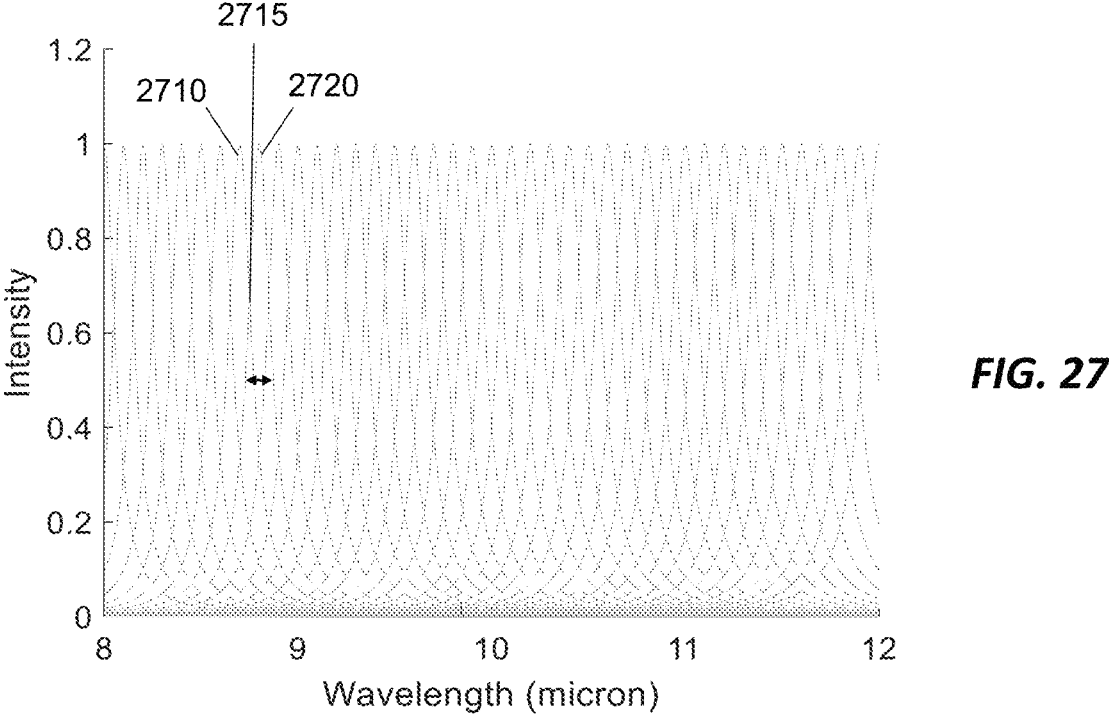

FIG. 27 plots overlapping transmission functions for an array of Fabry-Pèrot filters.

Figure 28:
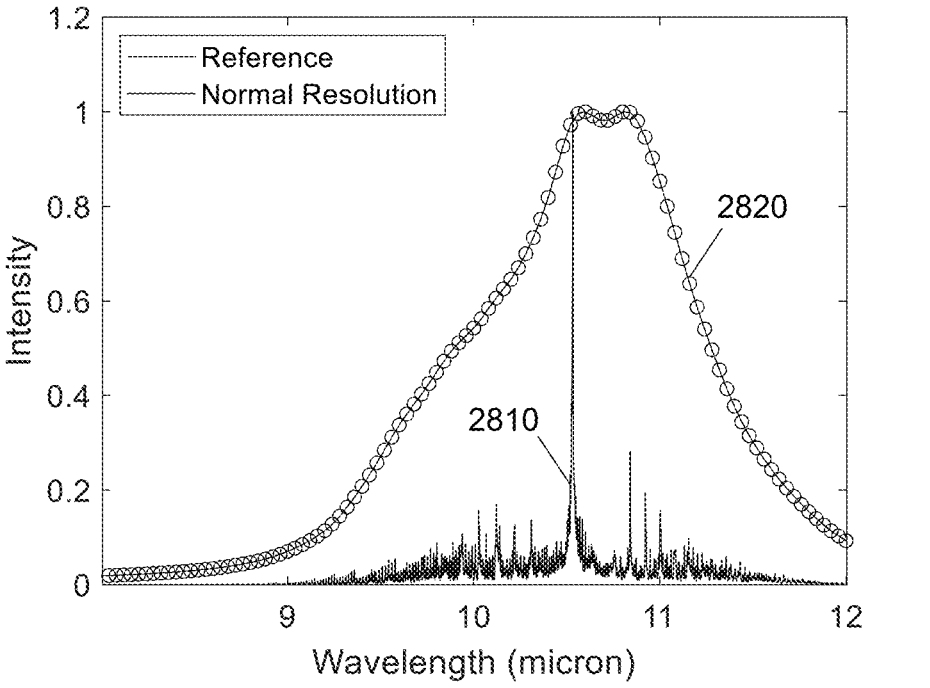

FIG. 28 plots a reference spectrum and a measured spectrum using a Fabry-Pèrot filter array with overlapping transmission functions.

Figure 29:
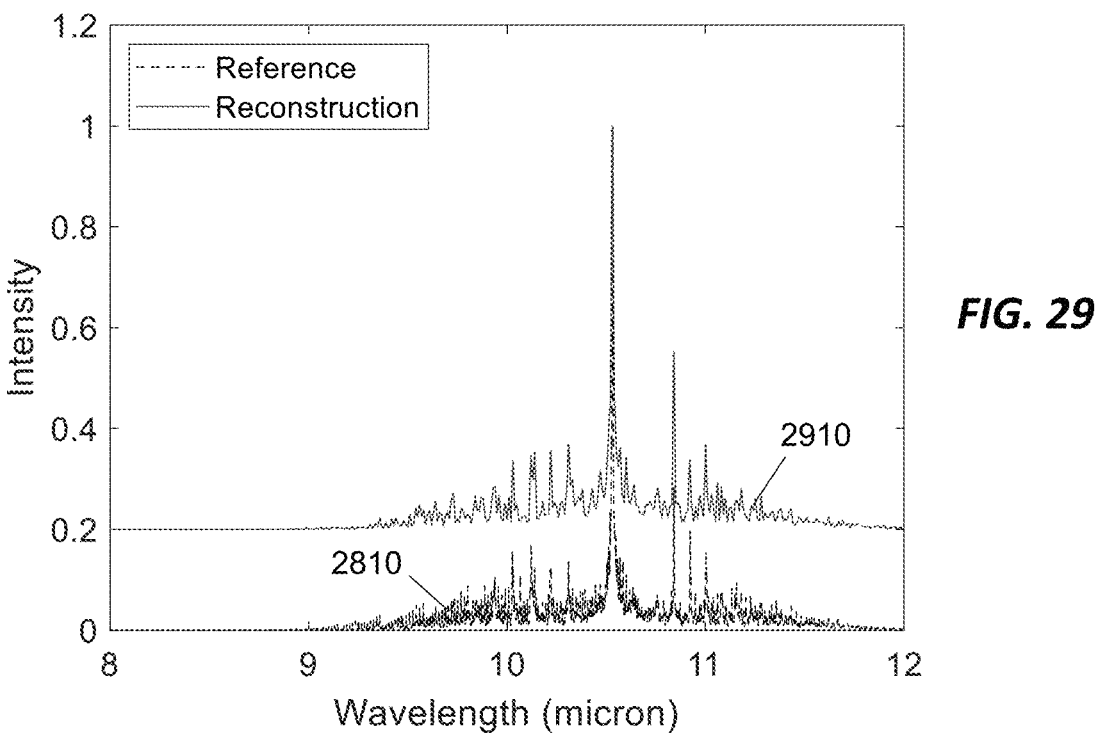

FIG. 29 plots a deconvolved spectrum obtained from the measured spectrum of FIG. 28 and plots the reference spectrum for comparison.

Figure 30:
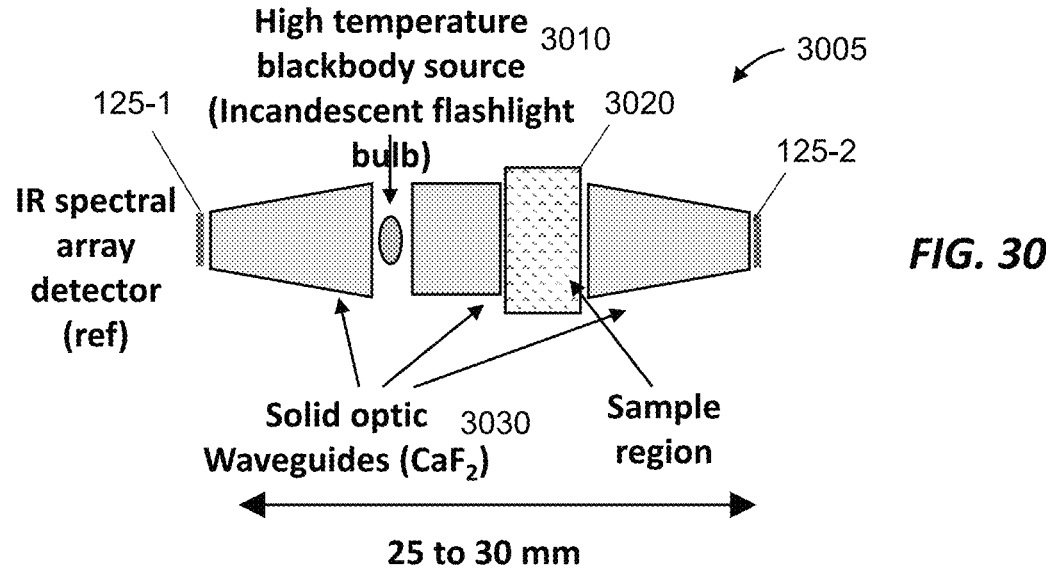

FIG. 30 depicts an example of a compact spectrometer for spectral analysis of a sample.

Figure 31:
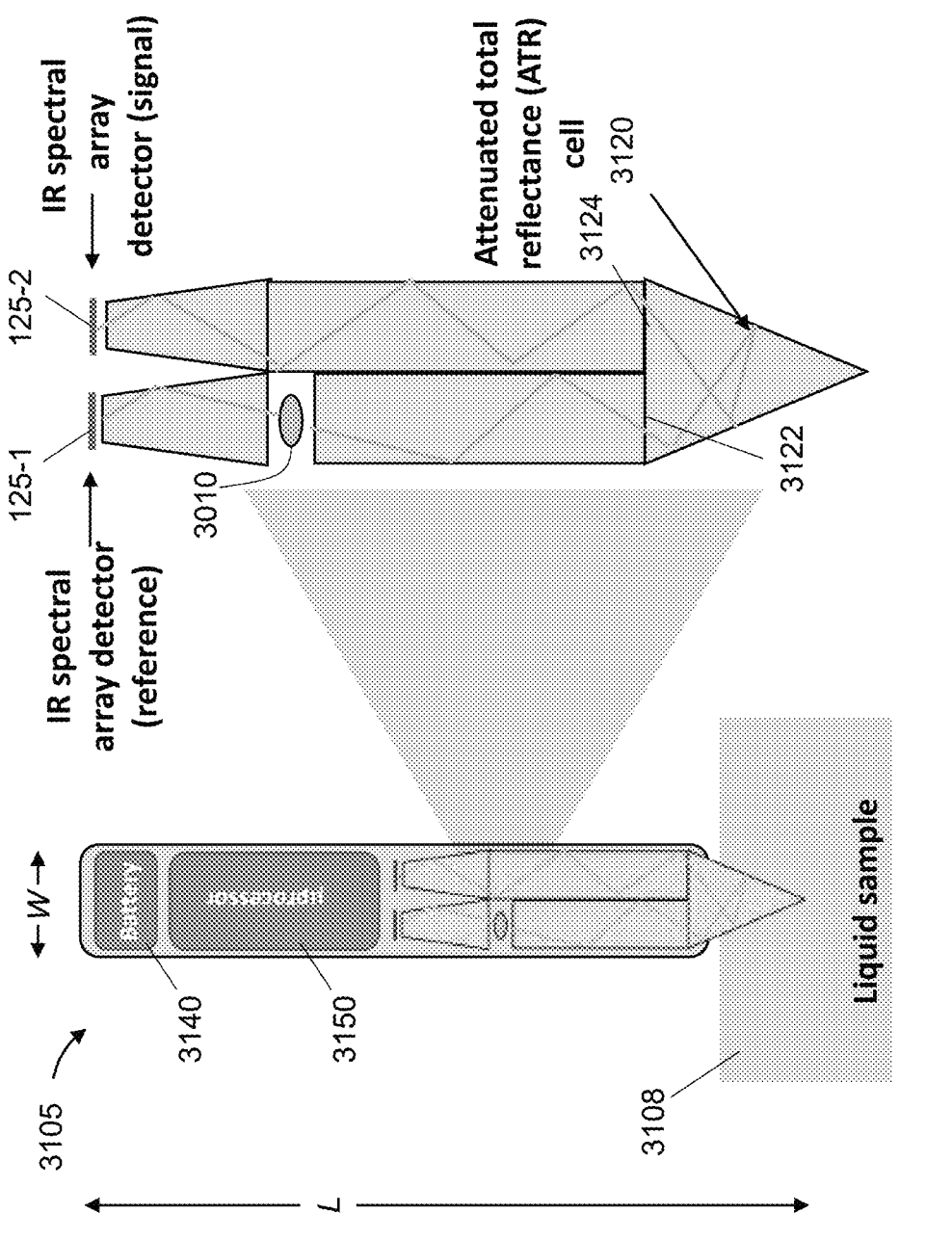

FIG. 31 depicts another example of a compact spectrometer for spectral analysis of a liquid sample.

DETAILED DESCRIPTION

1. Overview

Figure 1:
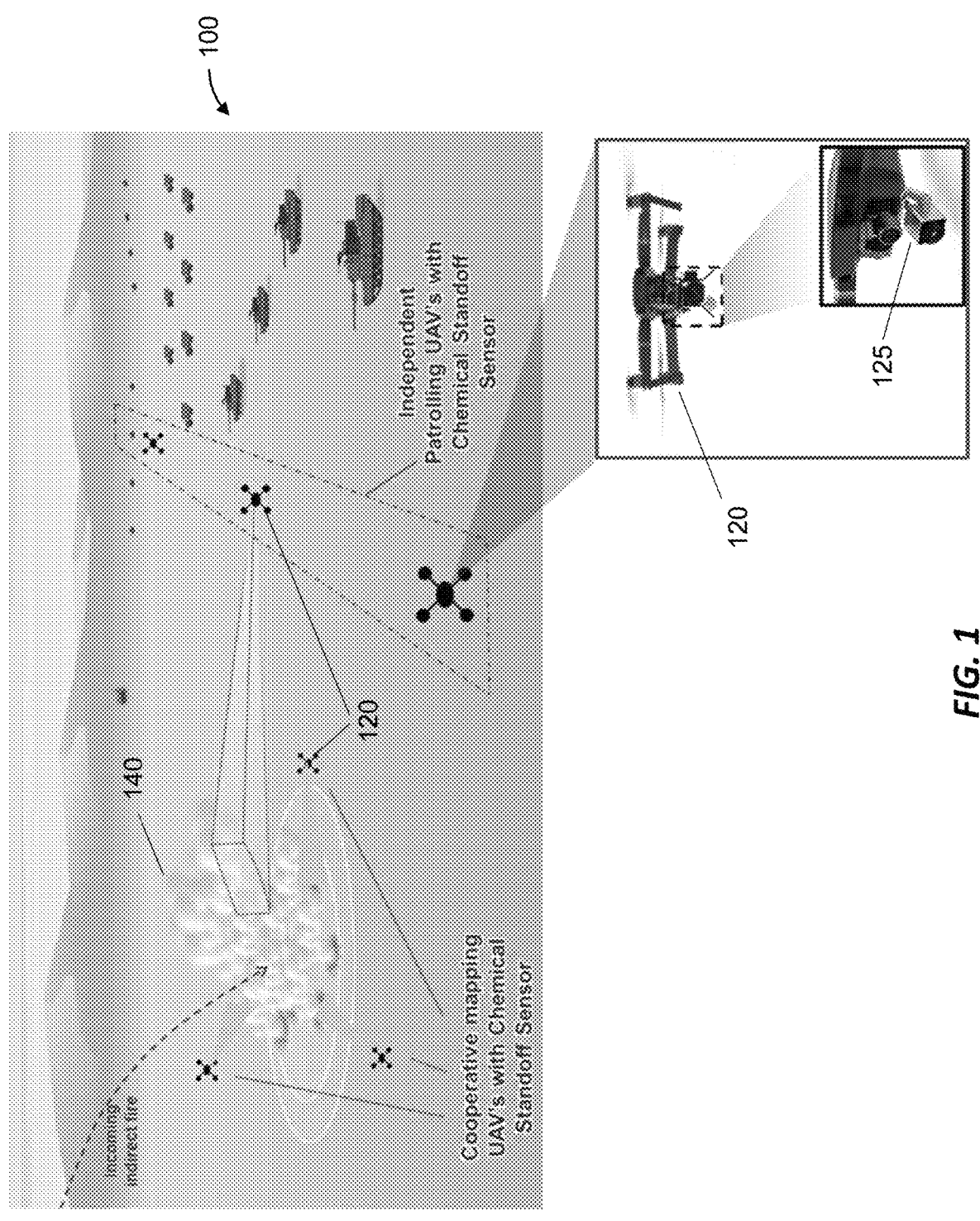
FIG. 1 illustrates an example application for a hyperspectral standoff snapshot spectral sensor deployed on a micro-unmanned aerial vehicle for chemical warfare agent detection.

An example application for a standoff spectral sensor 125 with low-SWAP characteristics is illustrated in FIG. 1. In some cases, the standoff spectral sensor 125 is compatible with operation of a lightweight, unmanned aerial vehicle (UAV) 120 (e.g., a UAV 120 that weighs less than 20 pounds and has an operating altitude less than 1,200 feet above ground level). The spectral sensor 125 can detect, identify, and map vapor phase chemical warfare agent threats in a field forward operation 100. Multiple UAVs 120 with the standoff chemical agent sensors 125 can be used to monitor a large area in such an operation. Each UAV 120 can act independently to monitor a defined area of regard. If a UAV 120 detects a threat plume 140 it would signal to other UAVs 120 to move to the area of detection and the UAVs 120 would begin to cooperatively map and track the release plume 140.

Figure 2:
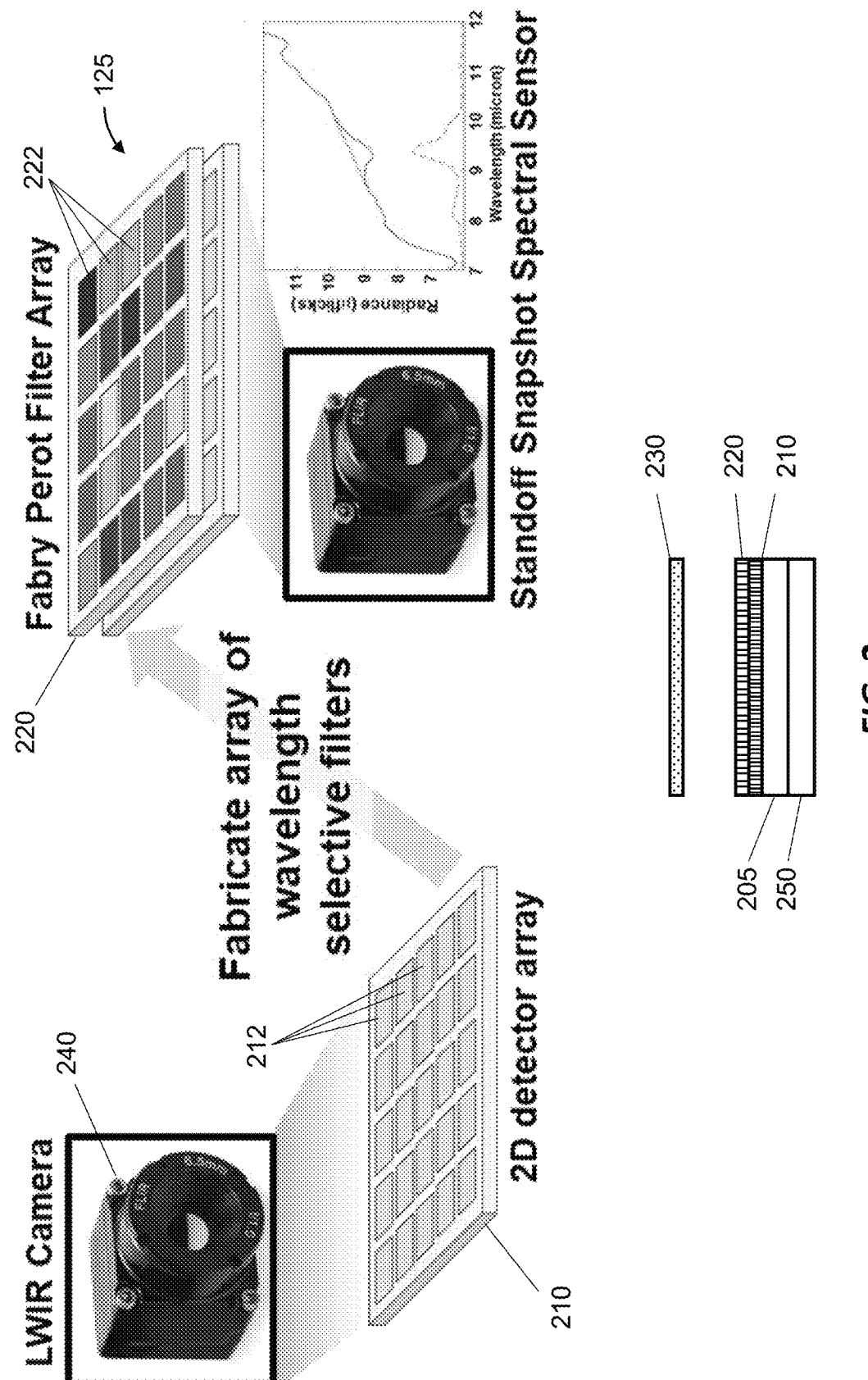
FIG. 2 depicts components of a spectral sensor and a packaged spectrometer.

The standoff spectral sensor 125 can have significantly reduced size, weight, and power limitations as well as reduced cost compared to conventional chemical sensors. The spectral sensor 125 is compact and lightweight such that it could be mounted on UAVs 120 described above. An example of the spectral sensor 125 is depicted in FIG. 2. The standoff spectral sensor 125 can be chip-scale and integrated into a spectrometer. The spectral sensor 125 comprises a detector array 210 of LWIR detectors 212 and a filter array 220 of fixed bandwidth Fabry-Pèrot filters 222 (having different spectral passbands) optically coupled to pixels of the detector array. In some implementations, the spectral sensor 125 can be packaged with additional optics and other spectrometer components (e.g., power source, controller, memory, etc.) in a housing, such as a packaged spectral camera 240.

Each Fabry-Pèrot filter 222 in the filter array 220 passes a narrow optical wavelength band to one or more corresponding detectors 212 in the detector array 210. Multiple Fabry-Pèrot filters 222 can be tuned to pass (or reflect for a reflection implementation) different wavelength bands. As an example, a 160×120 LWIR detector array 210 (such as the low cost, low-SWAP FLIR Lepton 3) has a total of 19,200 detectors 212. The filter array 220 can be composed of 32×24 filter elements where each Fabry-Pèrot filter 222 covers a 5×5 set of detectors 212. If each Fabry-Pèrot filter 222 was a different wavelength band, the 32×24 element array could detect as many as 768 different wavelength bands. Each wavelength band can be a narrow range of wavelengths (e.g., a full-width-half-maximum (FWHM) bandwidth between 10 nm and 1000 nm for center wavelengths in a range from 8 microns to 12 microns). In some implementations, a wavelength band can have a FWHM bandwidth between 250 nm and 750 nm.

The inventor has determined that it is not practical or necessary to have 768 different wavelength bands for a low-SWAP spectral sensor 125 that operates in the range of interest (8 microns to 12 microns). Instead, the spectral sensor 125 can be fabricated to detect 132 different wavelength bands with 40 nm spectral spacing and each wavelength band is reproduced 5 times. This filter layout can provide IR spectral coverage from 7.36 microns to 12.64 microns. For some applications, even fewer wavelength bands (e.g., no more than 20 or no more than 40) can be used for adequate spectral coverage.

Such an example standoff spectral sensor 125 can provide functionality that is not currently available. A Peltier-cooled version of this standoff sensor provides a standoff range of up to 5 km and even up to 10 km and sensitivity of other, heavier, more complicated devices. For example, a Peltier cooler 250 can be thermally contacted to a spectral sensor 125 that is formed on a substrate 205. Uncooled versions of this standoff spectral sensor 125 provide new operational sensing capability as a result of greatly reduced SWAP and cost. The uncooled standoff spectral sensor 125 may have less range (e.g., up to 1 km) than a cooled version, but the uncooled version could be mounted on UAVs or used as person borne (helmet or suit) systems. These low-SWAP standoff spectral sensors 125 could be used as a swarm of UAVs to monitor a large battlespace and autonomously map CWA threat plumes 140 in three dimensions. Helmet mounted systems could be used by first responders to provide situational awareness as they enter laboratories, factories, warehouses, buildings, or other hazardous situations (e.g., fires where there may be a release of hazardous chemicals).

An example implementation of the spectral sensor 125 described herein is based on a 32×24 element filter array 220. The outer edge elements, or an outer portion, of the filter array 220 can be used for testing and alignment. The remaining elements in the filter array 220 (30×22 elements in this example) comprise 660 Fabry-Pèrot filters 222 which can be divided into 132 different wavelength bands with each wavelength band reproduced five times in the filter array 220. The filter array 220 can provide 0.04-micron wavelength separation between center wavelengths for each wavelength band to cover the 7.36 micron to 12.64 wavelength range. The filter array 220 can be sized to fit different sized detector arrays 210. One implementation of the filter array 220 includes 60-micron-square Fabry-Pèrot filters 222. Another implementation includes 400-micron-square Fabry-Pèrot filters 222. Each Fabry-Pèrot filter 222 can cover multiple detectors 212, though the invention is not so limited. In some implementations, one Fabry-Pèrot filter 222 can cover only one detector 212. Each detector 212 can couple to only one Fabry-Pèrot filter 222 but each Fabry-Pèrot filter 222 can be coupled to one or more detectors 212.

Gray-scale photolithography can be used, in part, to fabricate the Fabry-Pèrot filters 222 that pass or reflect different wavelength bands as described below. At least one optical component 230 included with the spectral sensor 125 (e.g., as part of a packaged spectral camera 240) can be adapted to homogenize emissions from the field-of-view across all of the detector array 210 and eliminate the spatial dependence of the field-of-view in the spectral domain. Homogenizing the emissions can avoid missing detection of a spectral component that occupies a small region in the field of view. For example, its image could fall only on one or more filters that do not pass the wavelength band from that small region. In such an implementation, the packaged spectral camera 240 can be a non-imaging camera. The optical component(s) 230 can include a random phase plate, diffusor, fly's-eye or micro lenses, prismatic sheets, etc. or some combination thereof.

Example filter arrays 220 can be fabricated using photo-lithographic and etch methods to form different etch depths (and etalon cavity thicknesses) in a germanium or other semiconductor cavity layer. A grayscale photolithography mask can be used to pattern the Fabry-Pèrot filter array 220. The different cavity thicknesses determine the center wavelength of each Fabry-Pèrot filter 222. In one example, a fabricated device wafer includes test structures, and 24×32 element Fabry-Pèrot filter arrays 220 with 60×60-micron filter elements and 400×400-micron filter elements. The thicknesses of the etalons can be measured using an FTIR microscope. The FTIR microscope can also be used to characterize the optical properties of the Fabry-Pèrot filters 222. Reflectance measurements show the fabrication of optical cavities where the cavity thickness, and therefore the transmission wavelength, of the Fabry-Pèrot filter 222 was defined by the gray scale lithography.

Additionally, a 400×400 element filter array 220 is coupled to a FLTR Boson detector array 210 to record scene radiance as a function of temperature. These measurements show the wavelength-dependent filter response as a function of the cavity thickness. Further details are presented in the following sections.

2. Fabry-Pèrot Filter Array

Figure 3:
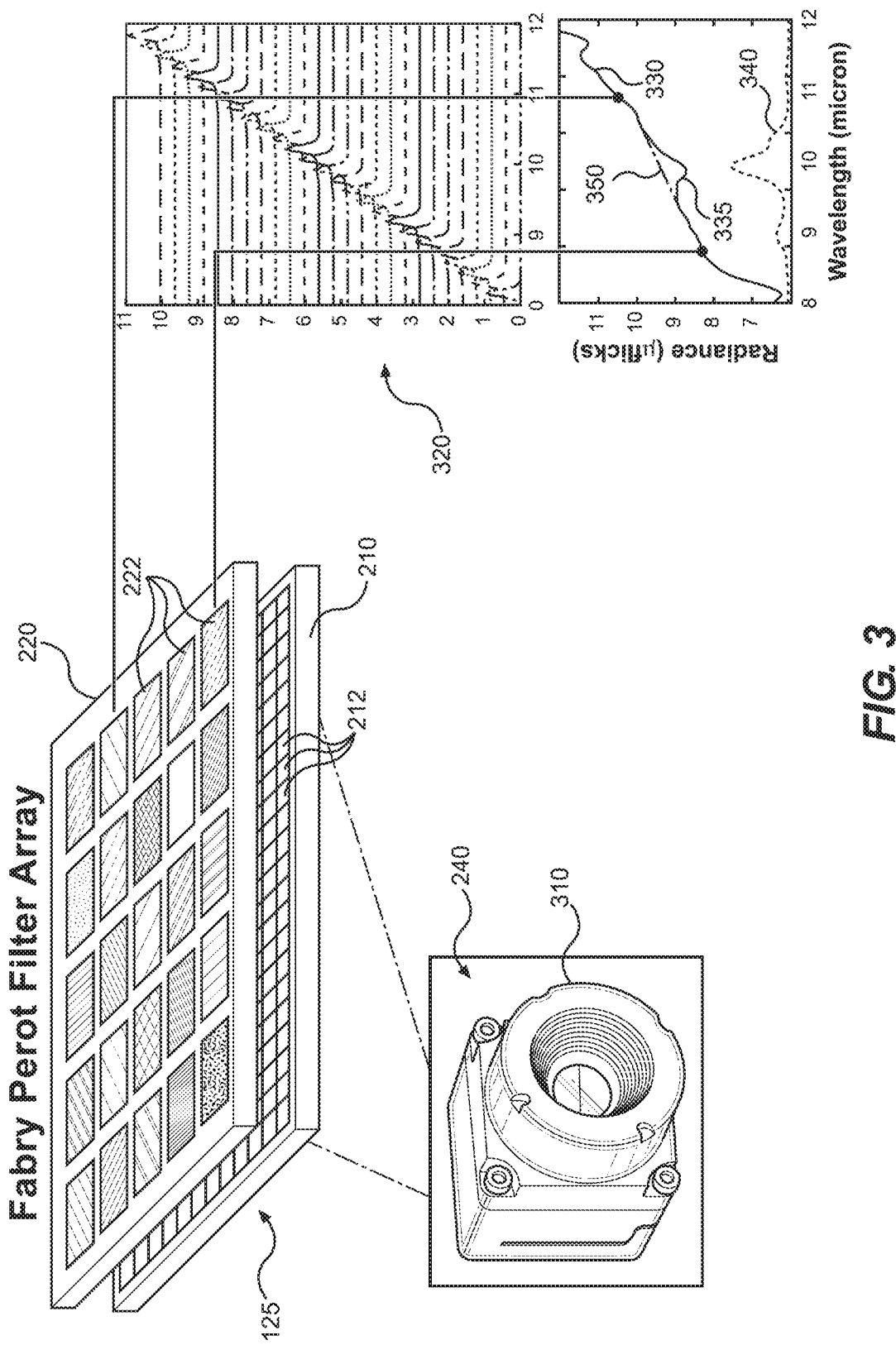
FIG. 3 illustrates the components and packaged spectrometer of FIG. 2 along with target transmission functions or bandpasses for the filters in the Fabry-Pèrot filter array.

FIG. 3 illustrates the operation of an example hyperspectral standoff spectral sensor 125 (which may also be referred to as a "snapshot sensor") that includes a Fabry-Pèrot filter array 220. The Fabry-Pèrot filter array 220 is in optical communication with a detector array 210 of the spectral sensor 125. Camera optics 310 (which can include optical components 230 of FIG. 2) are designed to evenly illuminate the filter array 220 with the radiance from the camera's field-of-view. Radiance from the scene viewed by the camera 240 is incident on the Fabry-Pèrot filters 222 and each filter has a defined bandpass as depicted by the multiple wavelength plots 320 in FIG. 3. There are 26 different bandpasses plotted in FIG. 3. Radiance in a filter's passband is transmitted to one or more corresponding detectors 212 in one or more pixels of the detector array 210 behind the filter array 220. Depending on the design of the filter array 220 and the detector array 210, from 1 to 100 detectors can be illuminated with radiation passed by a single Fabry-Pèrot filter 222, though a larger number of detectors may be illuminated by a single filter in some applications.

The intensity signals from the detectors 212 behind the corresponding Fabry-Pèrot filter 222 can be averaged to provide the scene radiance for the wavelength band passed by that Fabry-Pèrot filter 222 to the corresponding detector (s) 212. The average intensity is used to produce one point on the radiance spectrum 330, also plotted in FIG. 3. If the Fabry-Pèrot bandpass is repeated with other filters 222 in the filter array 220, the average intensity values from each repeated filter can be averaged together to produce a point on the radiance spectrum 330. Each Fabry-Pèrot filter 222 in the filter array 220 that passes a different wavelength band provides a signal to produce other points on the radiance spectrum 330. Accordingly, a snapshot of the output from the spectral sensor 125 gives the radiant intensity for the bandpass of each Fabry-Pèrot filter 222 and can be used to generate the radiance spectrum 330 for a scene viewed by the camera 240. Additional signal processing can be used to improve the resolution of the radiance spectrum 330, as described below, and detect the presence of a chemical component.

The example radiance spectrum 330 can be altered by the presence of a chemical component, such as a harmful gas. In the plot of FIG. 3 containing the radiance spectrum 330, an absorption spectrum 340 of a harmful gas is also plotted. Presence of the harmful gas in the field-of-view of the camera 240 produces a dip 335 in the radiance spectrum 330 that would not be present in a reference spectrum 350 obtained for the field-of-view when the harmful gas is not present.

2.1 Fabry-Pèrot Filter Structure

Figures 4, 5:
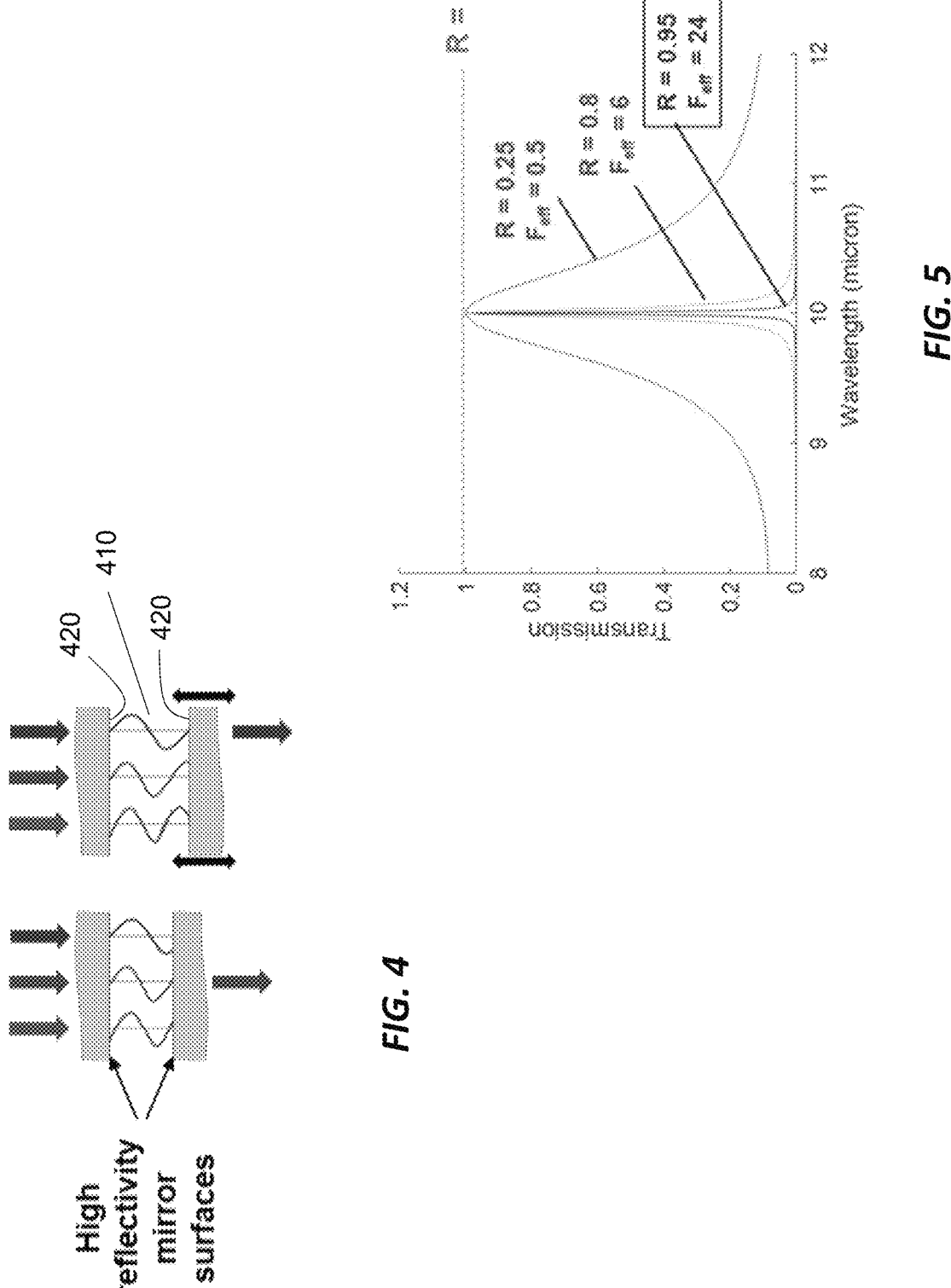
FIG. 4 illustrates operation of the Fabry-Pèrot filters. The optical bandpass of the filter depends on the optical path length between the mirror surfaces.
FIG. 5 is a plot of transmission as a function of wavelength from EQ. 1 for different mirror reflectivities, a 5-micron mirror separation, and cavity refractive index of 1.

According to some implementations, each Fabry-Pèrot filter 222 in the filter array 220 comprises an optical resonant cavity 410 that is formed between two parallel reflective mirrors 420 (which may be reflective surfaces), as illustrated in FIG. 4. The wavelengths that are transmitted by the cavity 410 with low loss are wavelengths that have a zero node or near zero node in the electric field vector at essentially the mirror boundaries of the cavity. The transmission efficiency of the filter can be described by the quality factor (Q) of the resonant cavity 410 and depends on the reflectivity of the mirrors 420. Higher mirror reflectivity provides better spectral resolution, as can be seen in the plots of transmission as a function of wavelength for different mirror reflectivities R in FIG. 5.

Without being bound to a particular theory, the filter's transmission $\tau_r$ can be expressed as follows.

$$\tau_r = \frac{T^2}{(1-R)^2}\left[1 + \frac{4R}{(1-R)^2}\sin^2\left(\frac{2\pi\mu t \cos\theta}{\lambda}\right)\right]^{-1} \qquad (1)$$

T is the transmission of each mirror 420, R is the reflectance of each mirror 420, $\mu$ is the refractive index of the material filling the cavity 410 between the mirrors 420, t is the thickness or length of the cavity 410 between the mirrors 420, $\lambda$ is the wavelength of radiation incident on the filter, and $\theta$ is the incident angle of the radiation. Each Fabry-Pèrot filter 222 can have flat, parallel, and smooth mirror surfaces when fabricated and the components of the cavity 410 preferably have negligible intrinsic absorption of the radiation. The reflectivities of these mirrors controls the bandpass of the filter, as shown in FIG. 5.

2.2 Bragg Mirrors

According to some implementations, Bragg mirrors 420 are used to bound the top and bottom of the Fabry-Pèrot cavity 410. Bragg mirrors 420 can be formed by alternating thin-film layers of material having different optical properties (e.g., different refractive index values). In some cases, the alternating layers can be dielectric material (e.g., oxide and semiconductor or two different semiconductors). A risk with such alternating layers is the adhesion of the thin film layers to the substrate and to each other. Adhesion failure and delamination of the layers can degrade mirror reflectivity or even render the mirror unusable. The materials choices for the thin-film layers in the multi-layer Bragg mirror define the performance of the mirror and also the risk of delamination. Increasing the number of layers of high and low index materials increases the reflectivity of the Bragg mirror 420 but also increases the risk of delamination.

Figure 6A:
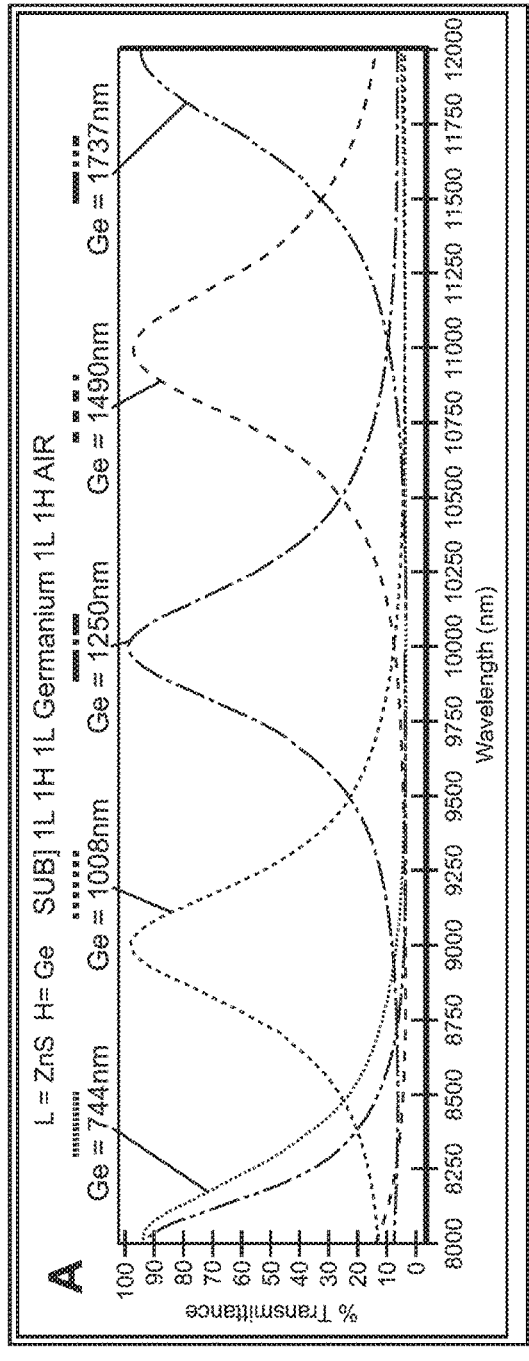
FIG. 6A and FIG. 6B are plots of filter performance as a function of the number of layers for a 1-pair Bragg mirror (A) and a 2-pair Bragg mirror (B).
Figure 6B:
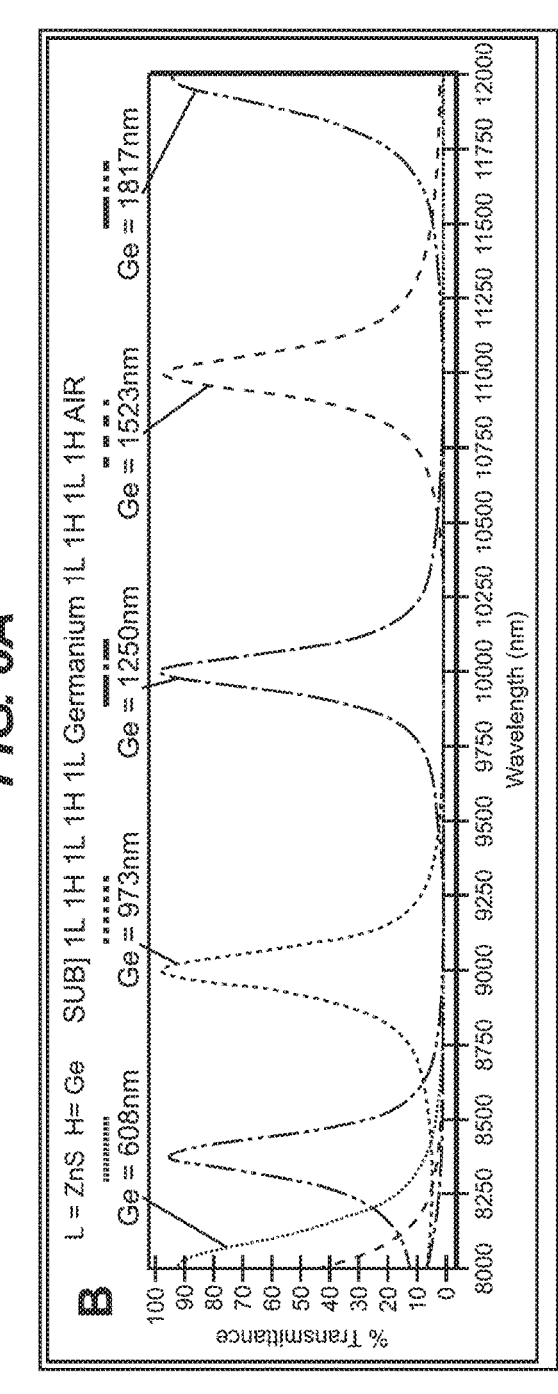

FIG. 6A and FIG. 6B show the calculated performance of two different designs of Bragg mirrors 420. The high index material in the mirror stack is germanium and the low index material is zinc sulfide. The etalon material in the resonant cavity 410 is also germanium. FIG. 6A illustrates the transmittance of a Fabry-Pèrot filter 222 where a single pair of thin-film layers is used for each Bragg mirror 420. Several plots are generated for different thicknesses of the germanium etalon in the cavity 410. FIG. 6B illustrates the transmittance of a Fabry-Pèrot filter 222 where four thin-film layers (two pairs of layers) are used for each Bragg mirror 420. The two-pair mirror has a narrower passband to provide finer spectral resolution.

2.3 Sensor Resolution

Figure 7:
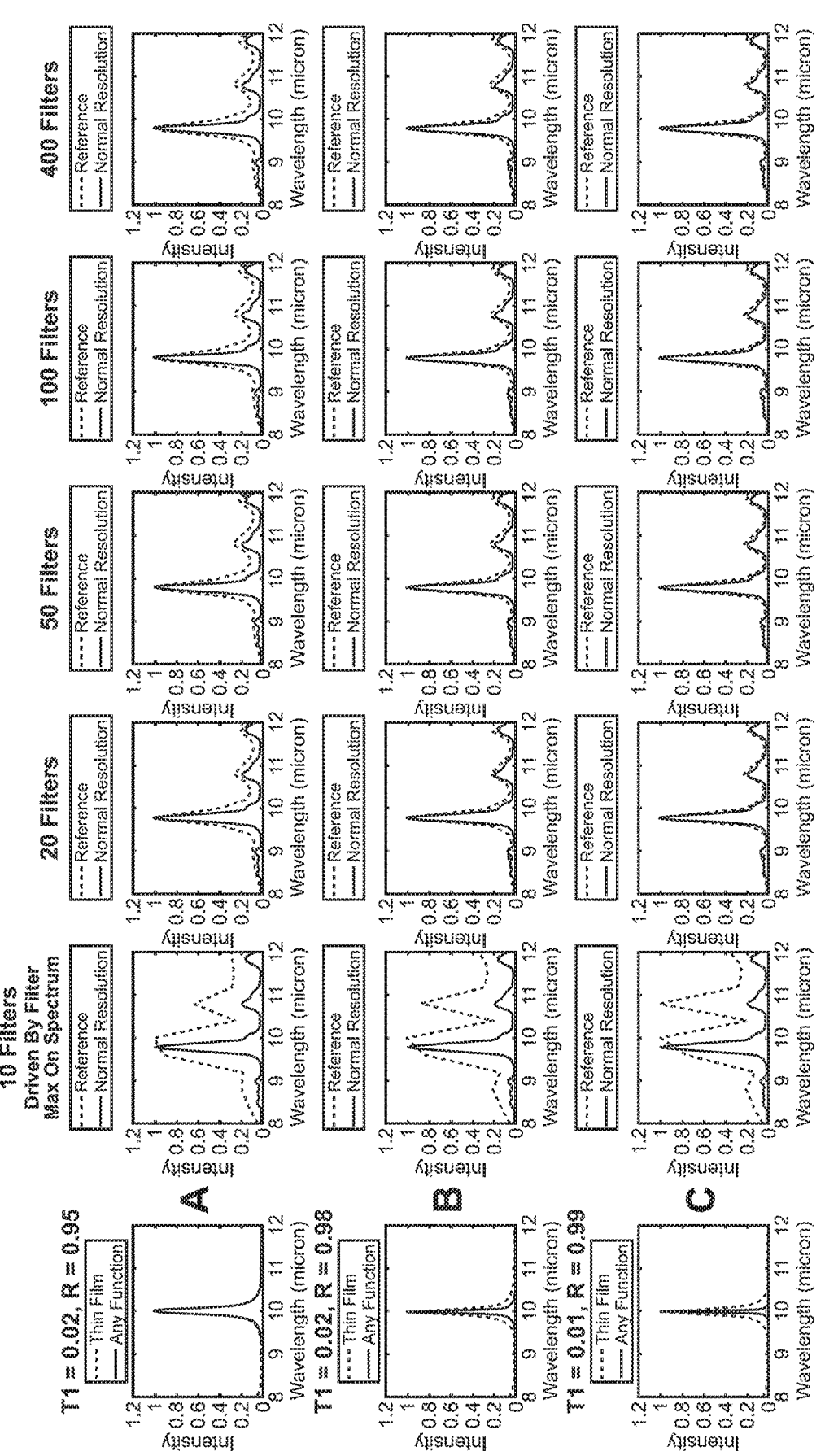
FIG. 7 illustrates spectrum measurement fidelity based on the filter bandwidth and the number of different filter frequencies in the Fabry-Pèrot filter array. The spectrum of Sarin CWA is used as a test case.

FIG. 7 shows multiple plots generated from a modeling study to evaluate spectral resolution of spectrometer that uses the spectral sensor 125. The plots reveal tradeoffs between the spectrometer's resolution and the number of different Fabry-Pèrot filters 222 used in the spectral sensor 125 and the spectral bandpass of the filters 222. The row labeled "A" shows the sensor's spectral resolution based on the two-pair mirror design of FIG. 6B with a 95% reflectivity (R=0.95) of the cavity mirrors 420. The sensor's spectral resolution improves (along with accuracy of detecting a reference sarin spectrum) when the number of Fabry-Pèrot filters 222 at different bandpass wavelengths increases in the sensor. With only 10 filters of different bandpass wavelengths, the sensor's spectral reconstruction depends primarily on the sampling of the spectrum by the sensor's overall spectral sampling function. With 20 or more Fabry-Pèrot filters 222 having different passbands, the spectral reconstruction depends more on the passband of the individual Fabry-Pèrot filters 222. With a mirror reflectivity R=0.95 there is little improvement in the sensor's spectral resolution when increasing the number of filters above 20 and not much improvement when increasing the number of filters from 50 to 100 or more.

Increasing the reflectivity of the mirrors 420 decreases the widths of the passbands of the Fabry-Pèrot filters 222 and increases the spectral resolution of the spectral sensor 125, as can be seen in the rows of plots labeled "B" and "C" in FIG. 7. The mirror reflectivities are increased to R=0.98 (row "B") and R=0.99 (row "C"). The increase in mirror reflectivity increases the measurement fidelity of the spectral sensor 125. However, since the bandwidth of each Fabry-Pèrot filter 222 is reduced there is also a decrease in the number of photons that reach the detector and an associated reduction in signal to noise ratio (SNR). The tradeoff between sensor resolution and SNR may impact the overall sensor design.

3. Grayscale Lithography and Cavity Fabrication

Initial considerations for fabricating the filter array 220 included defining a fabrication process and identifying the materials that could be brought into a fabrication facility and used to create the filter array. There are significant constraints on materials since many materials may be incompatible with the other work that is done in the fabrication facility and can negatively impact fabrication facility operations. Germanium and zinc sulfide can be used to fabricate the Fabry-Pérot filter 222 without deleterious effects on other fabrication facility operations where the filter arrays would be made. However, other fabrication facilities may tolerate other materials, and the invention is not limited to only germanium and zinc sulfide material for constructing the Fabry-Pérot filter 222.

Figure 8:
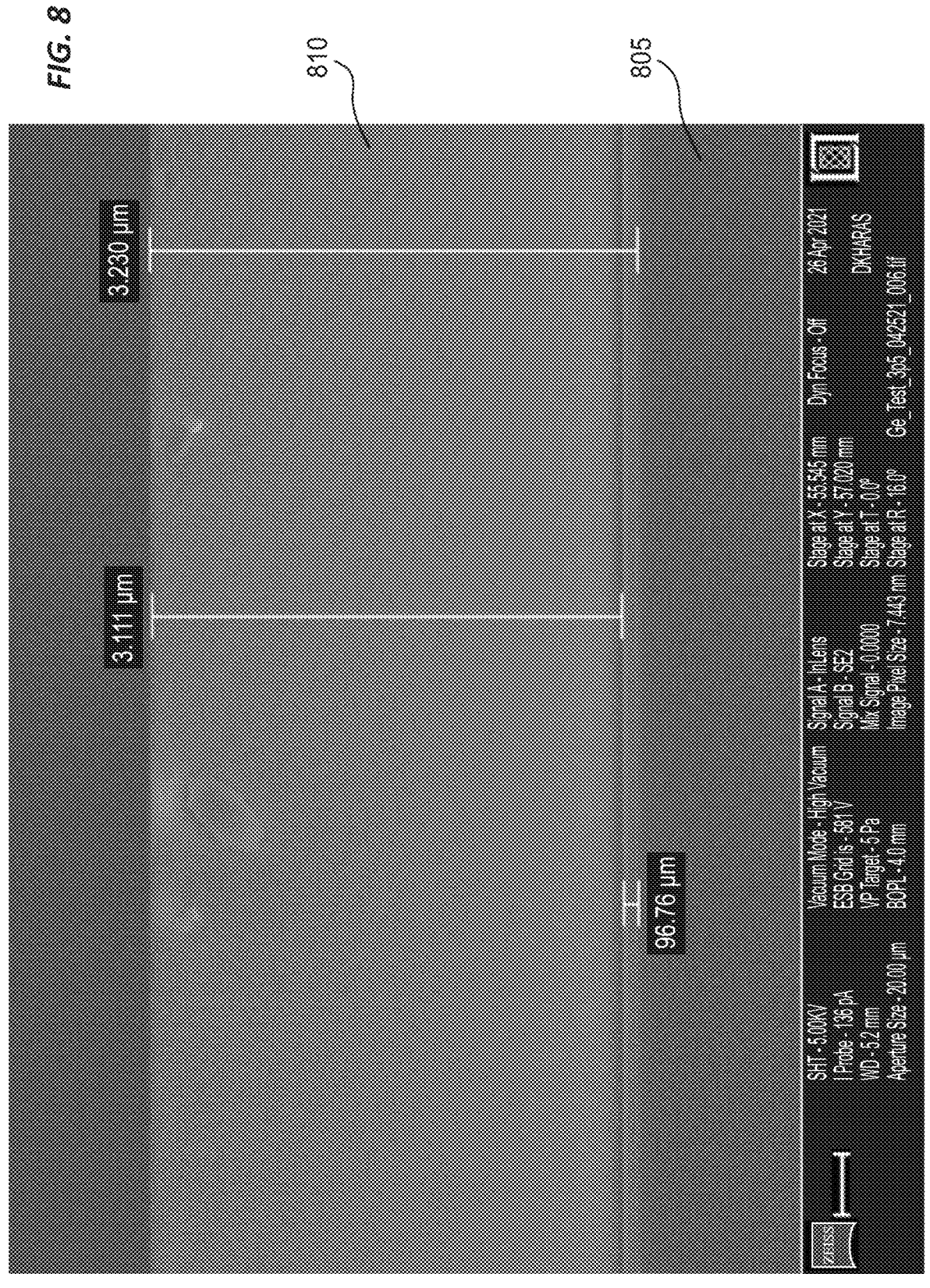
FIG. 8 shows a scanning electron microscope image of a cross-section of a germanium layer on a silicon wafer.

Several processes such as grayscale photolithography and etching were developed in order to fabricate the final Fabry-Pèrot filter array 220. Much of the process development was carried out on inexpensive and readily available silicon wafers on which there was deposited an additional germanium layer. This germanium layer was processed in the same way that the germanium cavity 410 would be processed in the final filter array 220. FIG. 8 is a scanning electron microscope (SEM) image showing a cross section of an example wafer having about three microns of germanium 810 deposited on a silicon wafer 805. A Wordentec e-beam deposition tool created the 3.1-micron-thick amorphous Ge layer on the silicon test wafer shown in FIG. 8.

Grayscale lithography has been used to create complex features in silicon using a microelectronic fabrication process. FIG. 9 and FIG. 10A through FIG. 10D illustrate grayscale photolithography for generation of step heights in a photoresist 910 deposited on a substrate 905. A mask 1020 having different features sizes is used to expose the photoresist 910. The step heights generated in the photoresist 910 can later be transferred to different etch depths in the underlying substrate 905 by an etching process (e.g., reactive ion etching).

FIG. 9 is an overview of grayscale photolithography. A first mask 920 has large feature sizes and openings between features that are larger than the resolution limit for the exposing wavelength and optical stepper. Accordingly, patterns on the first mask 920 are reproduced in the photoresist 910 with high fidelity. FIG. 9 also shows masks 922, 924 with grating patterns where the feature sizes are smaller than the resolution limit for the exposing wavelength and optical stepper used to "pattern" the photoresist 910. In these cases, the masks 922, 924 create aerial images of uniform intensity. The fine features on the masks 922, 924 cannot be transferred to the photoresist 910 with high fidelity. The uniform aerial image is created by filtering out all of the higher order image components in the transform plane of the optical path of the stepper tool. Only the zeroth order of the illumination is used, and all of the modulation structure of the image is lost to create an even spatial illumination. Now, the intensity of the illumination depends only on the fill factor of the grating pattern on the mask. At these very small feature sizes, the mask acts like a uniform neutral density filter where the optical density of the filter is proportional to the grating fill factor used on the mask. The uniform intensity of the aerial image defines the relative exposure dose over an area in the resist 910 that corresponds to an area of the grating pattern on the mask. The exposure dose determines the thickness of the photoresist 910 after developing the photoresist. The different photoresist thicknesses represent different step heights.

FIG. 10A through FIG. 10D illustrate further details of grayscale photolithography. For the illustrated example, a germanium etalon layer 1015 (which can be used for a Fabry-Pèrot cavity) is deposited on a silicon wafer (substrate

Figures 10A, 10B:
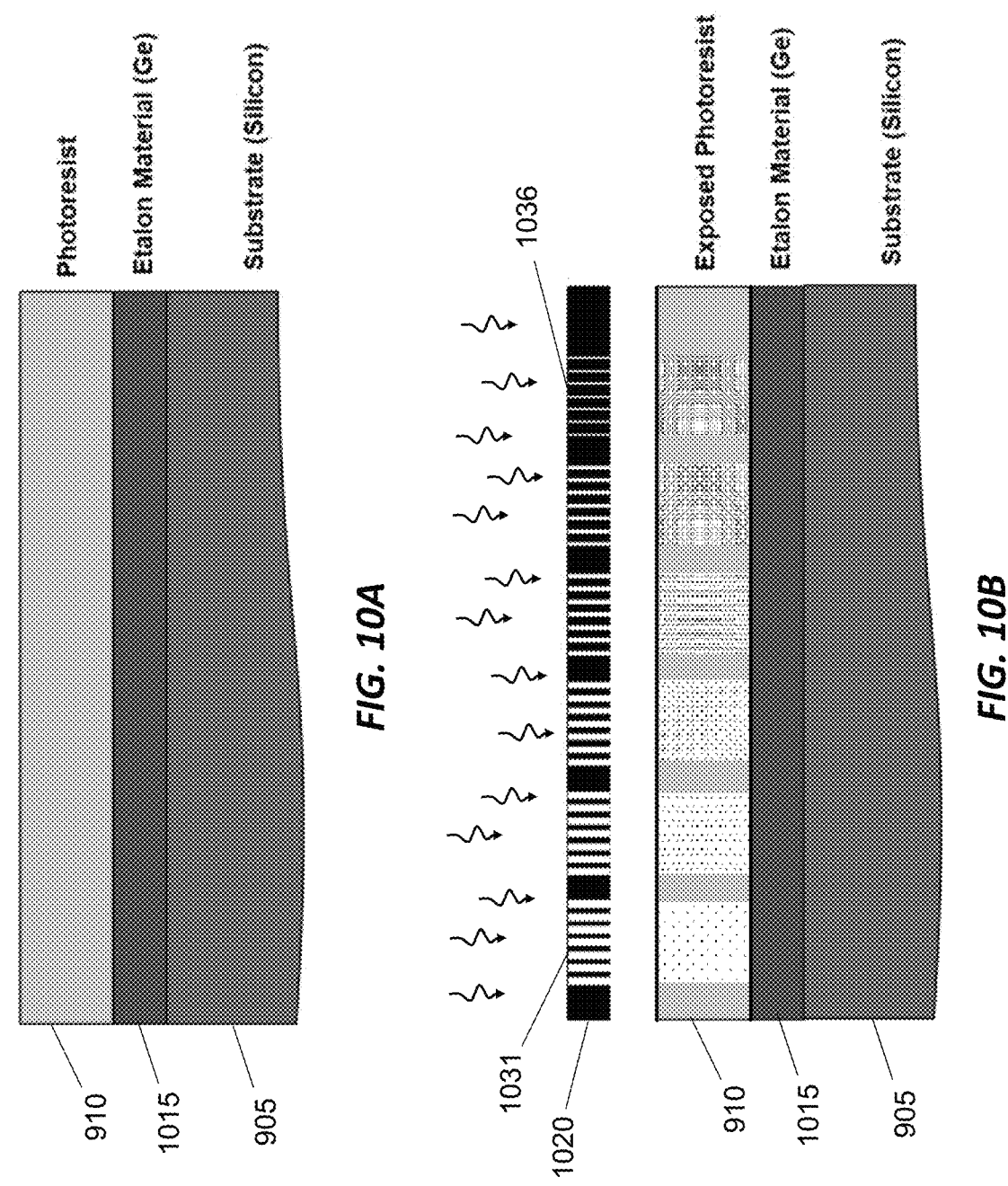

905) and covered with a photoresist 910. A portion of the resulting structure is shown in FIG. 10A. The photoresist 910 is then exposed (FIG. 10B) in an optical stepper using a grayscale mask 1020 having different grating or grid patterns 1031, 1036 on the mask with feature sizes below the resolution limit of the optical stepper. For the illustrated example, there are six patterns on the mask with different fill factors. Pattern 1031 has the lowest fill factor, transmitting a higher optical dose (indicated by the light shading) into the photoresist 910. Pattern 1036 has the highest fill factor, transmitting a lower optical dose (indicated by darker shading) into the photoresist 910. To simplify the illustration, FIG. 10B does not show the lenses of the optical stepper between the grayscale mask 1020 and photoresist 910 that would be present during exposure.

Figures 10C, 10D:
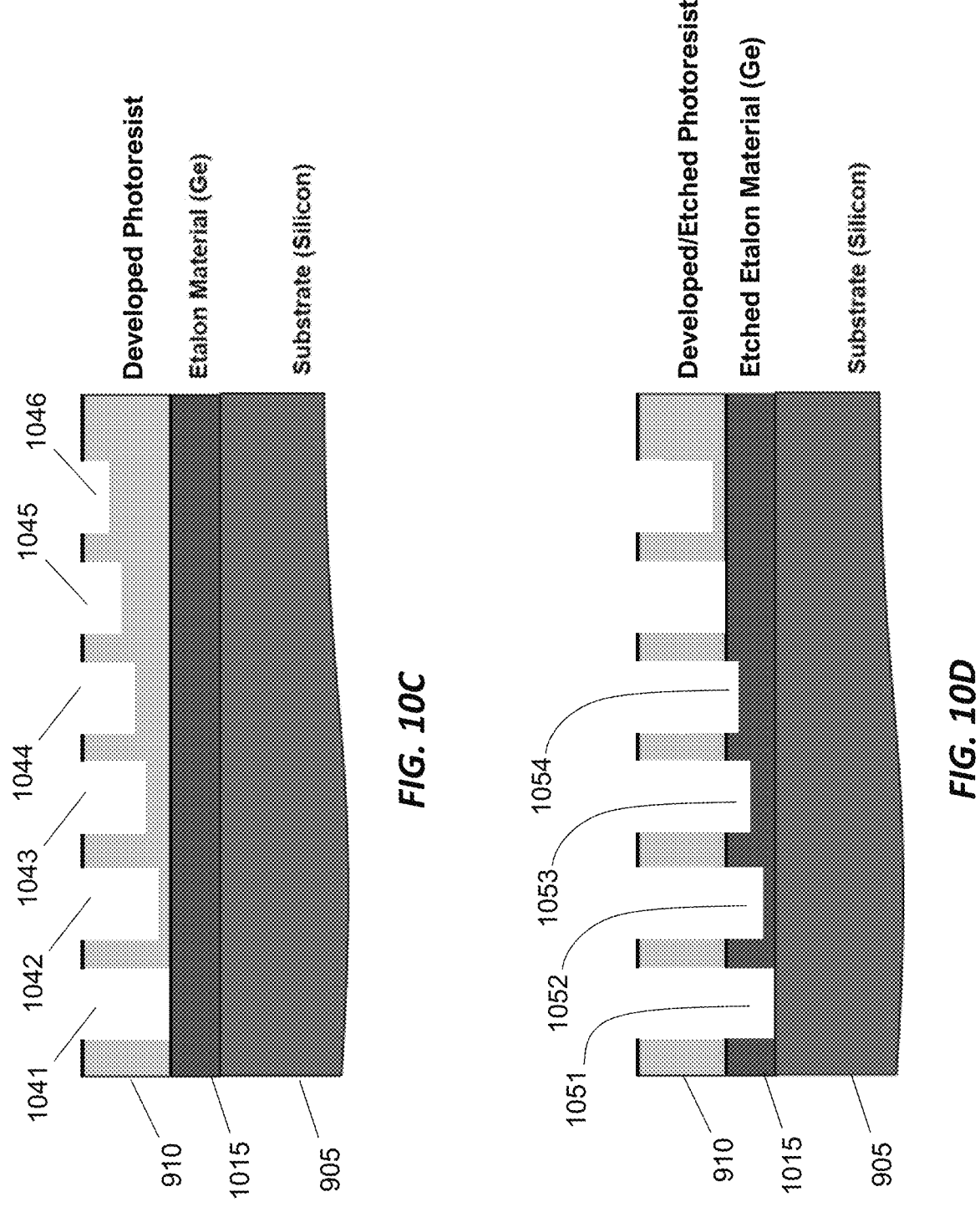

The resist is subsequently developed, resulting in the structure shown in FIG. 10C. For the highest dose, a depression 1041 (e.g., a hole or trench) is formed in the photoresist 910 and may extend all the way to the germanium etalon layer 1015. The lower doses may not clear the resist, resulting in different step heights of resist from the first depression 1041 to the sixth depression 1046.

The wafer can then be subjected to an etching step (e.g., an anisotropic reactive ion etch) that etches the photoresist 910 and the germanium etalon layer 1015 at similar rates (e.g., etching rates within 20% of each other). The etching can transfer the step heights in photoresist 910 to step heights in the germanium etalon layer 1015, resulting in the structure illustrated in FIG. 10D. The photoresist 910 can be stripped from the wafer so that subsequent processing steps can be carried out (e.g., steps to deposit a mirror over the etalon layer 1015).

For the illustrated example, the first four depressions 1041-1044 in the photoresist 910 are deep enough to result in etching of the underlying germanium etalon layer 1015. The first depression 1041 in the photoresist may lead to complete removal of the germanium etalon layer 1015, forming a void 1051. Depressions 1042, 1043, 1044 result in partial etching of the germanium etalon layer 1015, forming germanium etalons 1052, 1053, 1054 having different thicknesses. These etalons can be used for Fabry-Pèrot filters 222 having different passbands. By using the grayscale process, etalons for Fabry-Pèrot filters 222 having different passbands can be fabricated on a same substrate using a single exposure and a single etching step.

3.1 Example Grayscale Mask for Fabricating Germanium Etalons

An example mask was used for initial fabrication of germanium etalons of different thicknesses using grayscale photolithography. SPR 220 Novalac resist is a suitable photoresist 910 for grayscale photolithography and etching of the germanium etalon layer 1015.

The example mask includes multiple features in a test block for creating different etch depths in a germanium etalon layer on a silicon wafer, as described in connection with FIG. 10A through FIG. 10D above. FIG. 11A illustrates a test block 1100 that includes an array of 500-micron×500-micron grating areas 1110 each having different grating patterns that are designed to provide controlled constant illumination across corresponding areas in the photoresist and to expose the photoresist with different doses. There are 375 different grating areas 1110 in the illustrated test block 1100. FIG. 11A also shows further details of the pattern in two grating areas 1110. The grating areas 1110 have different grating pitches "P" (indicated in nanometers along two sides of the test block 1100) and different fill factors (indicated as percentage values along top and bottom edges of the test block 1100). The enlarged illustrations in FIG. 11B and FIG. 11C show a portion of the small-scale structure within each grating area 1110. The grating areas 1110 in each row have the same pitch and the fill factor is varied across the row. The width of the grating lines 1115 in each grating area 1110 can be obtained by multiplying the pitch for the row times the fill factor for the column.

As described above, the fill factor for a pattern on the mask controls the amount of uniform illumination that exposes the photoresist 910 on the wafer. The grating areas 1110 with smaller fill factors provides the most illumination and higher exposure dose in the photoresist 910. The higher dose results in a thinner layer of photoresist 910 after development. The grating areas 1110 with higher fill factors have less open area and transmit less light. Their corresponding exposed areas in the photoresist 910 have a thicker remaining layer of photoresist 910 after development. Since the photoresist acts as a destructible mask during etching, the etch chemistry works through the photoresist layer and begins to etch the germanium layer. The thinner photoresist etches through more quickly than the thicker photoresist, and the etch starts etching the germanium sooner under the thinner photoresist than under the thicker photoresist. Thus, the thinner photoresist results in a deeper etch depth and thinner germanium etalon 1052 and the thicker photoresist results in a shallower etch depth and thicker germanium etalon 1054, as can be seen in FIG. 10D.

FIG. 12 shows a visible camera image of an array of germanium etalons fabricated in a germanium layer on a silicon wafer using grayscale photolithography and the example mask having the test block 1100 of FIG. 11. The enlarged images are SEM images of a germanium etalon fabricated from one of the grating areas 1110 (having a pitch of 875 nm, line width of 481 nm, and 55% fill factor). The highest resolution SEM image shows a smooth surface of the etalon (at the resolution of the SEM) and also shows a step height (etch depth) of 1.8 microns, meaning that the remaining etalon thickness is about 1.3 microns.

An FTIR microscope is a useful tool for characterizing the photolithography results and measuring the step heights (equivalent to etch depths) in the germanium etalon layer 1015. The FTIR microscope can be set up for reflectance measurements but can also be used for transmission measurements. Since the silicon carrier wafer does not transmit the entire 8- to 12-micron spectral range, the reflectance measurements are a suitable way to evaluate the properties of the germanium etalon layer 1015 on the silicon substrate. Germanium has a relatively high refractive index (n~4 at these wavelengths) and the large index change between air and germanium creates a large surface reflection. A weaker surface reflection occurs at the germanium-silicon interface (n~3.42 for silicon at these wavelengths). These surface reflections create a weak interferometric effect that modulates the transmission intensity that is described by EQ. 1. The FTIR microscope is used to measure the reflectance $r_r$ of the germanium etalon layer 1015 as a function of wavelength. The transmission through the germanium etalon layer can be approximated by subtracting the reflectance from 1 ($\tau_r$=1−$r_r$).

FIG. 13 shows a plot of the transmission (derived from 1−$r_r$) of the germanium layer. FIG. 13 also shows a fit to the data using EQ. (1) with free parameters for the mirror (surface) reflectivity and the thickness of the germanium layer. In this case the mirror reflectivity was 0.11 and the germanium layer thickness was 3.15 microns. The asterisks mark the expected peak transmission positions for the layer thickness.

FIG. 14 shows measurements of reflectance as a function of wavelength for multiple germanium etalons having different thicknesses. The etalons were fabricated from grating areas 1110 in the mask of FIG. 11A along the 575-nm-pitch row having different fill factors (from 22% to 80%). Also plotted are fits of the curves to EQ. (1). The mirror reflectivity R for EQ. (1) is held constant at 0.11 for the plots and the thickness t varied to obtain a fit to the measured data. Values of germanium etalon thickness t obtained from the fits to these measurements are plotted in FIG. 15 as a function of the corresponding fill factors for the measurements. The plot of FIG. 15 demonstrates that the germanium etalon thickness can be controlled by changing the fill factor of a grating pattern on a grayscale photomask that has sub-resolution-limit feature sizes.

3.2 Grayscale Photolithography Considerations

FIG. 15 also illustrates some issues to consider when using grayscale photolithography to form etalons for Fabry-Pèrot filters 222. At the higher fill factors (above ~0.6) the height of the germanium layer after processing is the same as the initial height (i.e., the germanium layer is not etched). At the higher fill factors there is insufficient dose in the photoresist 910 to allow removal of enough photoresist 910 during development. The subsequent etch process never penetrates through the photoresist 910 to reach the germanium etalon layer 1015 (as is the case for depressions 1045, 1046 in FIG. 10C). At low fill factors (below~0.2), the dose is so high that the photoresist 910 is too thin (or completely removed) after development. In this case the etch starts on the germanium etalon layer 1015 very early and completely etches through the germanium by the end of the etch step (as is the case for depression 1041 in FIG. 10C).

The data of FIG. 15 also indicates a process window for the fabrication of the germanium etalons. If the filter array 220 of the spectral sensor 125 (referring again to FIG. 1) is to have 100 different bandpasses in the array, then 100 different germanium etalon thicknesses are to be fabricated. In first order (n=1 node between cavity mirrors), with larger separation between transmission peaks (larger free spectral range) all of the etalons for the Fabry-Pèrot filters should have thicknesses between 1 micron and 1.5 microns, or between approximately those values. The fill factors for the grating patterns on the mask that correspond to those thicknesses are roughly between 0.35 and 0.39, which would mean control of the fill factor to better than 0.0004 per filter. Second order (n=2 nodes between cavity mirrors) has a smaller free spectral range but has a larger fill factor window from about 0.43 to 0.52. This would mean a precision of 0.0009 in the fill factor control to get 100 different wavelengths. Such sensitivity to fill factor is a fabrication challenge.

4. Fabrication of Fabry-Pèrot Filter Arrays

A fabrication process having a suitable probability of success for fabricating arrays of Fabry-Pèrot filters 222 is described. The process uses Ge substrate wafers. The fabrication process is compatible with processing in the microelectronics laboratory, which limits techniques and materials that can be used for fabrication of example Fabry-Pèrot filters. Fabrication of the Fabry-Pèrot filters using other facilities may permit use of wafers comprising other semiconductor materials (e.g., silicon, indium phosphide, gallium arsenide, etc.) along with use of other materials to form the Fabry-Pèrot filters.

FIG. 16A and FIG. 16B show an elevation view (FIG. 16A) and exploded view (FIG. 16B) of an example Fabry-Pèrot filter array 220. The exploded view shows the different layers and structures involved in the fabrication process. To aid illustration, the layer thicknesses are not to scale. The filter array fabrication process is based on working directly on a germanium wafer 1610, e.g., 200 mm germanium wafers. These wafers are electronic grade and are compatible with the fabrication facility to reduced concerns about introducing contamination into the facility.

4.1 Fabrication of High Reflectivity Bragg Mirrors and Filters

In a first step, dielectric layers for first Bragg mirrors 1620 were deposited on one 200 mm silicon test wafer and three 200 mm germanium wafers. Germanium and zinc sulfide are used for the dielectric layer of the Bragg mirrors 1620. These layers can be deposited by chemical vapor deposition or sputtering.

The silicon wafer is used as a representative wafer of the lot for elemental analysis to detect the presence of contaminants. Elemental analysis showed high levels of gold contamination, unacceptable for the facility. Further observations indicated that the gold contamination came from dust and surface transfer as the wafers were repackaged. The wafers were cleaned by "scrubbing" the wafers with a very fine calcium oxide polishing compound using a chemical mechanical polishing (CMP) step to remove the surface contamination. One of the cleaned germanium wafers was sent for elemental analysis. The gold contamination on the germanium wafer was measured to be $<50 \times 10^{10}$ atoms/cm$^2$, which was acceptable for further processing.

After the first Bragg mirrors 1620 were formed, a germanium etalon layer 1015 was deposited on the wafers and etched to different thicknesses using the grayscale photolithograpy process described above. Second Bragg mirrors 1622 were then formed over the germanium etalon layer 1015 to define the Fabry-Pèrot filters 222 having different bandpasses in the filter array 220.

4.2 Fabry-Pèrot Filter Array

FIG. 17 shows the layout of the filter array 220 having 24×32 Fabry-Pèrot filters 222. The grayscale in the drawing indicates the line-space ratio of the corresponding grating patterns on a grayscale photomask that would be used to form different etalon thicknesses for the Fabry-Pérot filters 222. There are edge filters 1722, 1724 located around the outside edge of the filter array 220 that are used for alignment. The corner filters 1724 shown in the lighter gray all have the same thickness that is designed to transmit 10.6-micron light. The edge filters 1722 with the darker tone are designed to transmit 8.6-micron light. These edge filters 1722, 1724 can show up as alignment features by selective illumination of the edge filters. For example, 10.6-micron illumination shows the corner filters 1724, whereas 8.6-micron illumination shows the edge filters 1722. The 8.6-micron light is selected in this example because that wavelength is at the edge of the silicon transmission, so silicon can be used as a filter to show the edges of the filter array 220.

With the outer edge filters 1722, 1724 used for alignment, the remaining 22×30 filters are used for the different Fabry- Pèrot filters 222 in the filter array 220. There are 660 Fabry-Pèrot filters 222 in the interior region but it is not necessary to have that many different wavelengths, as described in connection with FIG. 7 above, and it is not practical to try to control the grayscale lithography to that precision. Instead, there are 132 different gray levels, and each gray level appears 5 times in the filter array 220. The different Fabry-Pèrot filters 222 can be arranged in a pseudo-random pattern in the filter array 220. This random pattern is used to mitigate spatial inhomogeneity across the illumination of the detector array 210. The Fabry-Pèrot filters 222 are designed to operate in second order to utilize a larger process window in the grayscale photolithography process. The etalon thicknesses of the Fabry-Pèrot filter cavities vary between 1.84 and 3.16 microns with a 0.01-micron difference between steps. This range of etalon thicknesses nominally provides 132 different passbands across a spectral range from 7.36 microns to 12.64 microns.

In some implementations, the different Fabry-Pèrot filters 222 can be arranged in a pre-determined pattern (e.g., in a Bayer-type or other deterministic spatial pattern) across the filter array 220. The spectral sensor 125 can be thought of as a devices that maps spectral information in a field-of-view to a two-dimensional data matrix that represents a spectral fingerprint of the field of view, similar to the way in which a digital camera maps optical and spatial information to a two-dimensional data matrix that represents an optical image of the field-of-view. Accordingly, machine-learning processes (e.g., artificial intelligence applications) may be used to process the spectral two-dimensional data matrix to improve detection of spectra of interest (such as spectra of harmful chemical gases). Strategically grouping and locating spectral bands across the sensor array may help a machine-learning process identify a spectrum of interest and/or distinguish the spectral signature from background clutter.

4.3 Example Grayscale Mask Layout

FIG. 18 shows the layout for a die 1810 on an example grayscale mask used to pattern filter arrays 220 like those of FIG. 17. A Canon i-line stepper, used for grayscale photolithography, has a field size up to 50 mm×50 mm square. Up to the entire field size can be used for a single exposure. The die 1810 on the mask is used to create multiple filter arrays that match different detector arrays and can also provide arrays for testing purposes. For the example mask, there are grating areas 1820 to pattern four 24×32 filter arrays in the die 1810 where each Fabry-Pèrot filter 222 in the array has a 400 micron×400 micron square size. The die 1810 also includes 32 smaller grating areas 1830 for patterning 24×32 filter arrays where each Fabry-Pèrot filter 222 in the array has a 60 micron×60 micron square size. The die 1810 further includes a test block 1840, shown in further detail with enlarged views. Each element of the test block 1840 represents a different two-dimensional grid pattern 1850 with different x and y fill factors. The two-dimensional features (rectangles) of the grid patterns 1850 have more process latitude for the grayscale process than grating lines for determining the photoresist exposure doses. Consequently, grid patterns 1850 were used to pattern the filter arrays 220.

4.4 Anti-Reflection Coating

One silicon wafer and one germanium wafer, each having the stack of the first high reflectivity Bragg mirror 1620, germanium etalon layer 1015, and second high reflectivity Bragg mirror 1622, were coated with a front anti-reflection (AR) coating 1640 (FIG. 16A). These wafers demonstrated technical feasibility of the filter arrays 220. The front AR coating 1640 can significantly reduce losses due to surface reflections at the high index germanium front surface.

5. Filter Testing

Using grayscale photolithography and the above-described fabrication processes, multiple filter arrays 220 having Fabry-Pèrot filters 222 and test filters from the test block 1840 were fabricated on a silicon wafer and a germanium wafer. The silicon wafer was used as a trial of the fabrication process. Once the initial FTIR measurements of the silicon wafer were completed, the germanium wafer could be used to fabricate the filter arrays 220. The germanium Fabry-Pèrot filter arrays 220 were evaluated as follows.

Two different measurement setups were used to evaluate the filter arrays 220. The first measurement was to look at the filter in the longwave infrared using a FLIR Boson® microbolometer camera, available from Teledyne FUR of Wilsonville, Oregon. The filter array 220 was positioned in the field-of-view of the camera. The camera was used with its regular lens. An additional 1-inch diameter, 1-inch focal length lens was used between the filter array 220 and the camera to transfer the image of the filter array 220 to the camera's detector array. Images were recorded of the filter array 220 with and without additional back illumination. A bandpass filter (center wavelength 10 microns with 0.5 micron full-width-half-max value) was used in the optical path. Additionally, an FTIR microscope was used to measure the optical properties of the filter array 220 in both reflectance and transmission modes.

FIG. 19 shows an image of Fabry-Pèrot filters 222 in the test block 1840 that was recorded using the Boson® LWIR camera. The test block 1840 was illuminated from the back using a high temperature Globar source. One row of the filter array is not shown because the image field of the camera was limited by the size and focal length of the 1-inch diameter transfer lens. However, all of the squares from the 10% fill factor row were overexposed and the etalon layer 1015 was etched off of the wafer. Complete removal of the etalon layer is also observed for the 20% fill factor row in which the first 4 (and faint 5th) squares are visible.

FIG. 20A through FIG. 20C show images of filters 222 in the test block 1840 recorded with the FLTR Boson® camera 2030 and no additional illumination. FIG. 20A shows the measurement setup, including the position of the transfer lens 2010 with respect to the filter array 220. The 10-micron bandpass filter 2020 is also shown. FIG. 20B shows the passive thermal image of the array with the histogram of recorded intensities. The 10-micron bandpass filter 2020 is removed from the setup for the data of FIG. 20B. FIG. 20C shows the image with the 10-micron bandpass filter 2020 between the transfer lens 2010 and the camera 2030 together with the histogram. The changes in the images and histograms show the wavelength dependence of the reflectance on the different filter elements. The histograms show much more intensity in the image with the bandpass filter than without. This is the result of the thermal radiance from the camera 2030 being reflected back to the camera by the bandpass filter 2020. Much of the radiance from the camera 2030 that is not transmitted through the bandpass filter 2020 is reflected back to the camera and detected.

The second measurement setup uses the FTIR microscope to evaluate the Fabry-Pèrot filters. FIG. 21A illustrates parameters of the test array block. The number within each entry of the matrix gives the relative illumination intensity (normalized to 1) passed by each test grid pattern 1850. Zero fill factor would correspond to an illumination intensity of 1, whereas 100% fill in x and 100% fill in y would correspond to zero illumination intensity passed by the grid pattern 1850. The highest illumination intensity occurs for 10% fill factors in x and y. The lowest illumination intensity occurs for 100% fill factor in x and 90% fill factor in y. The shading in the matrix indicates the useful exposure range for making etalons of different thicknesses for the Fabry-Pèrot filters 222. The middle shading 2110 in the middle of the matrix (for relative intensities between 0.59 and 0.89) indicates areas where the photolithography and etch process creates different etch depths in the etalon layer 1015 that produce passbands at different wavelengths. Lower shading 2120 for lower fill factors indicates overexposure of the resist and excessive removal of the etalon layer 1015. Upper shading 2130 for higher fill factors indicates exposure intensities that are too low to impact the etalon layer (the etalon layer is unetched and the filters all have the same spectral profile, upper plots in FIG. 21B).

FIG. 21B shows the measured spectra of the filters. The spectra are measured in reflectance but are shown as transmission (derived from reflectance as transmission=1−reflectance). The spectra at the top of FIG. 21B all have a feature at 10.6 micron and are from underexposed photoresist and an unetched etalon layer, corresponding to the higher fill factors in FIG. 21A.

The spectra shown in FIG. 21B can be rearranged in order of the transmission peak for comparison to the target filter transmission functions that are plotted in FIG. 3. This comparison is shown in FIG. 22A and FIG. 22B. The plot in FIG. 22A (reproduced from FIG. 3) shows the targeted transmission functions (for 25 filters not 132) while the plot in FIG. 22B shows transmission functions actually produced with filters fabricated in the test block 1840. Although the measured spectra look like the targeted spectra, some of the transmission spectra show additional spectral features at longer wavelengths. Also, as noted above, these FTIR measurements are based on reflectance measurements, not transmission measurements.

6. Discussion of Test Filter Results

To understand the origins of the additional spectral features in FIG. 22B, consider the results from the measurement of germanium layers (no Bragg mirrors) on silicon shown in FIG. 13. These measurements are shown in the top graph "A" of FIG. 23. In FIG. 23 (graph A), the thickness that was derived from the fit to the data of FIG. 13 is used to predict what the filter's transmission curve would look like if there were 98% reflective Bragg mirrors on the top and bottom of the Fabry-Pèrot cavity. The resulting curve 2310 shows the spectral behavior that the filter is designed to achieve. The middle panel of FIG. 23 (graph B) shows what was actually observed for the reflectance measurement cast as transmission and there are a number of additional peaks observed in reflection measurement. The origins of these additional peaks can be understood in terms of the design specification and initial Bragg mirror fabrication.

The high reflectivity Bragg mirrors were supposed to be deposited onto two germanium wafers and one silicon wafer. Each stack was supposed to terminate in a low-index ZnS layer. Generally, however, creating a high reflectivity mirror and terminating with a low index layer are mutually exclusive. To compensate, the high reflectivity mirror may have included an additional quarter wave layer of germanium. The full 3.11-micron layer was deposited on the resulting stack. The wafers were then subjected to the photolithography and etch processes designed for the 3.11-micron layer. However, there was an additional high index quarter wave element in the design, so the process did not operate in the target second order but in the third order, which had a smaller free spectral range.

The operation in third order is indicated in FIG. 23. The top panel of FIG. 23 (graph A) is derived from FIG. 13 and shows the transmission derived from reflectance for the germanium on silicon features. Also shown in the top panel is the transmission curve 2310 that would be expected for the same thickness of germanium in a cavity between two high reflectivity mirrors. The top plot shows the expected free spectral range.

The middle plot of FIG. 23 (graph B) shows the transmission derived from the measured reflectance for one of the under-exposed grid patterns 1850 in the test block 1840. The thickness of the corresponding etalon layer was expected to be the germanium thickness deposited using the Wordentec tool. This plot shows more transmission peaks than would have been expected for the 3.11-micron thick germanium layer. The bottom plot of FIG. 23 (graph C) shows the calculated transmission spectrum for a 3.75-micron thick germanium layer. This calculation looks more like what is observed in the measurement.

The difference between the 3.75-micron layer that produces the calculated spectrum and the intended 3.11-micron layer is 0.64 microns. The thickness of the quarter-wave layer of germanium (refractive index ~4) at a 10-micron center wavelength would be $^{10}/_{16}$ micron, or 0.625 micron, which is consistent with the difference between the intended germanium thickness (3.11 microns) and the germanium thickness that reproduces the observed spectrum (3.75 microns). The 0.625-micron discrepancy and difference in transmission spectra can be attributed to the germanium layer deposited on top of the Bragg mirror stack in order to make a functioning high-reflectivity Bragg mirror. The additional spectral features that are observed in FIG. 22B are the result of the additional germanium thickness. The spectral features can be suppressed from the spectra of other devices by adjusting the layer thicknesses and/or compositions accordingly. For example, the etalon layer could be reduced in thickness to compensate for the quarter-wave germanium layer added to the Bragg mirror stack. Alternatively or additionally, the composition of the etalon layer can be changed to change its refractive index.

As discussed above, FIG. 23 presents transmission as "transmission derived from reflectivity" since reflectivity is measured using the FTIR microscope and transmission is then calculated assuming that there is no absorption or scattering in the Fabry-Pèrot filter. Additional measurements were made with the FTIR microscope reconfigured to directly measure filter transmission.

In order to make sure that the reconfigured FTIR microscope was functioning as expected to measure transmission spectra, the instrument was used to measure the transmission spectrum of a polystyrene film. Polystyrene film is a widely used standard for frequency and intensity calibration of FTIR instruments. FIG. 24A and FIG. 24B show the reference and measured polystyrene spectra, respectively. The match between these spectra show that the instrument is working as expected. A Fabry-Pèrot filter 222 was then measured in transmission using the FTIR microscope and the result is shown in FIG. 24C. The initial results showed very little transmission over the 8- to 12-micron range and very little of the expected filter bandpass. As a sanity check, the transmission of a Thor Labs 10 bandpass filter was measured. The filter had a center wavelength of 10 micron and a full-width-half-max value of 0.5 micron.

FIG. 25 shows a comparison of the measured transmission and reflectance spectra for two of the Fabry-Pèrot filter elements fabricated from two grid patterns 1850 in the test block 1840. One grid pattern 1850 has 50% x/80% y fill factors and the other pattern has 30% x/50% y fill factor. For both of these cases, the target peaks show very strong dips or notches in reflectance (suggesting high transmittance at those wavelengths). For the 30%/50% filter the reflectance notch is the strongest feature in the reflectance spectrum. However, the transmission spectra do not show significant transmission peaks corresponding to the reflectance notches. Instead, each spectrum shows a very small transmission peak at the reflectance minima. In both spectra there a numerous corresponding reflectance notches and associated transmission peaks, and the targeted filter peaks are impacted the most. The suppression of the target peaks may be due to absorptive adhesion layer(s) in the Bragg mirror stack.

The Fabry-Pèrot filters show weak transmission in the 8-micron to 12-micron range. FIG. 26 presents the results of the transmission measurements made with the FTIR microscope in a way that better indicates the targeted spectra shown in FIG. 3. The results indicate that grayscale photolithography can be used to create different etalon thicknesses for a working filter array 220.

7. Filter Spacing and Signal Processing

The inventor has recognized and appreciated that spectral resolution of a spectrometer that includes a spectral sensor 125 can be improved by spacing the passbands of the spectral sensor 125 judiciously and using appropriate signal processing techniques. For example, instead of completely separating the passbands of the Fabry-Pèrot filters 222 such that their passbands do not overlap by any significant amount, the passbands are located such that adjacent passbands overlap by an appreciable amount. In some implementations, the adjacent passbands are spaced such that a crossing of the adjacent passbands or transmission functions, corresponding to the two adjacent transmission functions, lies at a value no less than 10% of peaks of the two transmission functions.

FIG. 27 shows a plurality of such overlapping transmission functions corresponding to Fabry-Pèrot filters 222 in a filter array 220. There can be at least five or ten such overlapping transmission functions for a filter array 220. In the illustration, there are approximately 29 evenly-spaced transmission functions covering the wavelength range from 8 microns to 12 microns. The transmission functions overlap such that a crossing 2715 of two adjacent transmission functions 2710, 2720 lies at a value of about 65% of the peaks of the two adjacent transmission functions. Other crossing values are also possible. In an implemented device, the transmission functions can overlap such that a crossing 2715 of two adjacent transmission functions 2710, 2720 lies at a value in a range from 5% to 95% of the peaks of the two adjacent transmission functions. In some implementations having multiple transmission functions, the crossings 2715 need not all be at a same value of the transmission functions. There can be crossings 2715 of different values for different pairs of adjacent transmission functions. The crossings 2715 can be determined through filter design (e.g., determining a center wavelength for a filter, which is dependent on spacing or optical path length between the filters two mirrors, and determining a passband for the filter, which is dependent on mirror reflectivity or number of Bragg layers).

Although the functions are evenly spaced in the illustration of FIG. 27, they need not be. In some cases, there can be unequal spacing between transmission functions in a filter array 220. In some cases, some transmission functions may overlap by an appreciable amount (crossing at a 10% value or higher) and some transmission functions may not overlap by any significant amount (crossing at a 5% value or lower). In some cases, the crossing can at a value that is no less than 25%, no less than 50%, or even no less than 75%. There can be multiple transmission functions (e.g., at least 10) of the Fabry-Pèrot filters 222 that are spaced apart such that the peak transmission wavelengths of the different optical filters are different from each other by a value that is at least 10% or more of the full-width half-maximum (FWHM) value for the transmission functions. In FIG. 27, the FWHM value is indicated by a horizontal line with two arrows and the adjacent transmission functions are spaced apart such that their peak transmission wavelengths differ by and amount that is approximately 70% of the FWHM value of the adjacent transmission functions. When the FWHM value of adjacent transmission functions differ, the separation can be a percentage of the average value of the two FWHM values for the adjacent transmission functions.

In practical implementations, the transmission functions for the different Fabry-Pérot filters 222 may differ from each other (e.g., due to manufacturing variations that naturally occur in microfabrication processes). However, the Fabry-Pèrot filter transmission functions can be measured and characterized to develop a spectrometer response function.

FIG. 28 shows simulated results of a measurement of a reference spectrum 2810 with a spectrometer having Fabry-Pèrot filters 222 with overlapping transmission functions, like those illustrated in FIG. 27 but for a larger number of filters. The reference spectrum 2810 could correspond to the emission spectrum of a particular gas, for example. The raw, measured spectrum 2820 (where filter values are plotted as circles and interpolated with a continuous curve) barely resembles the reference spectrum 2810. However, knowledge of the spectrometer's transmission functions can be used to deconvolve the measured spectrum 2820 and recover a deconvolved spectrum 2910, shown in FIG. 29. For easier visual comparison, the reference spectrum 2810 is plotted again in FIG. 29 and the deconvolved spectrum 2910 is offset in intensity.

Measurement and deconvolution of the measured spectrum 2820 can be understood as follows. The intensity value $[I]_i$ at a wavelength on the measured spectrum 2820 for each Fabry-Pèrot filter 222 is an integral of that Fabry-Pèrot's transmission function multiplied by the reference spectrum that is being measured. The subscript i indicates the Fabry-Pèrot filter index. Each Fabry-Pèrot filter samples some of the spectrum to either side of the Fabry-Pèrot's FWHM values that can lie in at least one adjacent filter's transmission function. However, the weighting of the sampled spectral features will differ according to the filters' transmission functions. The deconvolution takes advantage of the sampling and different weighting when recovering the deconvolved spectrum 2910.

Another way of considering the spectrometer response is as follows. The spectrometer samples light at any given wavelength with different weighting values by multiple filters. Accordingly, the spectrometer response at any given wavelength can be written as a response vector (which can be determined through filter calibrations). A set of response vectors for different selected wavelengths can be formed into a response matrix $[C]_{i,j}$ that is representative of the spectrometer response function. The subscript j indicates a wavelength index for the selected wavelengths.

Without being bound to a particular theory, the deconvolution process can be expressed as $$[S]_j^* = [C]_{i,j}^{-1}[I]_i \qquad (2)$$

where $$[S]_j^*$$

is the recovered, deconvolved spectrum 2910, $$[C]_{i,j}^{-1}$$

is the inverse of response matrix $[C]_{i,j}$, and $[I]_i$ is the raw measured spectrum 2820. As can be seen in FIG. 29, the deconvolution accurately recovers the reference spectrum 2810.

8. Spectral Sensor Applications

The spectral sensor 125 can be used in different spectral sensing and diagnostic applications. FIG. 30 shows another low-SWAP spectrometer 3005 in which two spectral sensors 125-1, 125-2 and a radiation source 3010 are configured to analyze a sample placed in a sample region 3020. Radiation from the radiation source 3010 (e.g., an incandescent bulb) can travel to a reference spectral sensor 125-1, which measures a reference spectrum indicative of spectral emission from the radiation source 3010.

The radiation source 3010 can also emit radiation that travels to the sample region 3020 to illuminate a sample placed in the region. Radiation can pass through the sample and be detected by a second spectral sensor 125-2. Absorption of the radiation by the sample can alter the spectrum from the radiation source 3010. Comparison of the detected spectrum (obtained from the second spectral sensor 125-2) with the reference spectrum (obtained from the first spectral sensor 125-1) can reveal information about the material placed in the sample region 3020 (e.g., type or composition of gas or liquid). In some cases, radiation reflected by the sample may be analyzed instead of, or in addition to, radiation that passes through the sample. The configuration of the spectrometer 3005 can be modified (e.g., by rearranging the location of the second spectral sensor 125-2 with respect to the sample region 3020 and radiation source 3010 or adding a third spectral sensor) to detect radiation reflected from the sample.

In some cases, optical components 3030 can be included to direct radiation from the radiation source 3010 to the first spectral sensor 125-1 and/or to the second spectral sensor 125-2. For example, guiding optical components can be used to guide and/or homogenize the radiation from the radiation source 3010. The guiding optical components can be some combination of cylindrical, square, or polygonal shaped total internal reflectors, multimode waveguides, cylindrical, square, or polygonal shaped mirrors, conical mirrors, etc. In some cases, one or more lenses may be used in the optical assembly. As depicted, the distance between the spectral sensors can be no larger than 25 mm or 30 mm, though some devices may have a spacing between the spectral sensor that is no larger than 60 mm.

FIG. 31 depicts another configuration of a low-SWAP spectrometer 3105, which can be the size of a pen. The spectrometer 3105 can be used to analyze a liquid sample 3108. The device operates like that shown in FIG. 30 though the optical path between spectral sensors 125-1, 125-2 is folded. An attenuated total reflectance (ATR) cell 3120 is placed at the fold in the optical path. The ATR optic 3120 can be a solid optical component (e.g., a conical-shaped or prism-shaped solid optic) for which light entering a first portion 3122 of a face of the ATR optic 3120 undergoes total internal reflection (TIR) in the ATR optic 3120 and exits a second portion 3124 of the face of the ATR optic 3120. The radiation undergoing TIR is attenuated through evanescent optical fields that extend into the liquid sample 3108. This attenuation alters the spectrum emitted from the radiation source 3010 and the altered spectrum is detected by the second spectral sensor 125-2.

The low-SWAP spectrometer 3105 of FIG. 31 includes an on-board power source 3140 (e.g., one or more batteries) that is coupled to and powers an on-board controller 3150 (e.g., a microcontroller, microprocessor, digital signal processor, field-programmable gate array, or other signal processing device). The spectrometer 3105 can further include on-board memory (not shown) that is communicatively coupled to the controller 3150.

For the configuration of FIG. 31, the first spectral sensor 125-1 and second spectral sensor 125-2 can be formed on four different substrates (two for the first spectral sensor and two for the second spectral sensor). Alternatively, the first spectral sensor 125-1 and second spectral sensor 125-2 can be formed on two substrates (one substrate that includes both filter arrays and one substrate that includes both detector arrays).

The low-SWAP spectrometer 3005 of FIG. 30 can also be packaged to include an on-board power source that is operably coupled to and powers an on-board controller and on-board memory. A length L of the spectrometers 3105, 3005 can be no longer than 50 mm in some cases or no longer than 100 mm in some cases. A width W or diameter of the spectrometers 3105, 3005 can be no wider than 10 mm in some cases, no wider than 20 mm in some cases, no wider than 30 mm in some cases, or no wider than 50 mm in some cases. However, it is possible to package the spectrometer in assemblies having sizes larger than these values.

Though the above-described Fabry-Pèrot filter arrays, spectrometers, and signal processing techniques are described mainly for a long-wavelength infrared region (from about 8 micron wavelengths to about 12 micron wavelengths), the apparatus and/or techniques can be implemented for other wavelength regions. For example, the apparatus and/or techniques can be implemented for visible wavelength regions or near-infrared wavelength regions.

Though the Fabry-Pèrot filters, spectrometers, and signal processing techniques are described mainly for operation in transmission mode, the Fabry-Pèrot filters and spectrometers can be operated in reflection mode as mentioned above. When operating in reflection mode, the filter spacing can be determined from the notches in the Fabry-Pèrot filters' reflectivity functions. For example, the notch in a reflectivity function corresponds to a transmission peak in the transmission function, as indicated in FIG. 25. The reflectivity function can be subtracted from 1 to obtain a transmission function for each filter, and the spacing expressed in terms of FWHM values of the resulting transmission functions. The signal processing can use a reflectivity response matrix for the spectrometer to deconvolve the measured spectrum instead of a transmission response matrix. The deconvolved spectrum can then be subtracted from 1 to obtain a transmission spectrum for further analysis.

Though the filter arrays 220 and detector arrays 210 are described as being formed on different substrates that are later aligned and packaged together, it is also possible to form the filter arrays 220 and detector arrays 210 on a same substrate. For example, a detector array can be fabricated first on a substrate and protected with an oxide layer or other layer that transmits radiation to be detected. The filter array can then be fabricated over the detector array on the same substrate, aligned to the detector array.

Spectral analysis performed on data collected with the spectral sensor 125 described above can further include comparing a deconvolved measured spectrum with a background reference spectrum to determine the presence of absorption of the background reference spectrum at wavelengths that may indicate the presence of a chemical component. For example, the background reference spectrum can be obtained for a field-of-view when it is known that the chemical component is not present. The presence of the chemical component (such as a chemical gas) in the field of view can result in absorption of certain wavelengths in the reference spectrum. Subtracting the deconvolved measured spectrum from the reference spectrum can produce a difference spectrum that indicated the presence of the chemical gas.

9. Conclusion

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that inventive embodiments may be practiced otherwise than as specifically described. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein, unless clearly indicated to the contrary, should be understood to mean "at least one."

The phrase "and/or," as used herein, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of" or "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of." "Consisting essentially of," shall have its ordinary meaning as used in the field of patent law.

As used herein, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A spectral sensor comprising:
   a first substrate;
   an array of optical filters formed on the first substrate, each optical filter having:
   a first mirror formed on the first substrate;
   a second mirror spaced apart from the first mirror and in optical communication with the first mirror; and
   an etalon cavity formed between the first mirror and the second mirror;
   a second substrate;
   an array of long wavelength infrared (LWIR) detectors formed on the second substrate, the array of LWIR detectors in optical communication with the array of optical filters; and
   an optical element, disposed between a field-of-view of the spectral sensor and the array of optical filters, to homogenize emissions from the field-of-view across all of the array of LWIR detectors in the spectral sensor and eliminate a spatial dependence of the field-of-view in a spectral domain for the spectral sensor such that the array of LWIR detectors does not image the field-of-view, wherein:
   the array of optical filters includes at least 10 optical filters for which the etalon cavities of the 10 optical filters have different thicknesses such that the 10 optical filters have different transmission functions or different reflectivity functions,
   the etalon cavities of the 10 optical filters having the different thicknesses are all etched from a same layer of material on the first substrate, and
   the spectral sensor is assembled with the array of optical filters, the optical element, and the array of LWIR detectors in a package without Peltier cooling, the package having a size and weight to mount on an unmanned aerial vehicle weighing less than 20 pounds and to be flown by the unmanned aerial vehicle.

2. The spectral sensor of claim 1, wherein:
   the 10 different optical filters each have a transmission function with a peak transmission wavelength and a full-width half-maximum value of the transmission function;
   the peak transmission wavelengths of the 10 different optical filters are different from each other by a value that is at least 10% of the full-width half-maximum value; and
   each transmission function of the 10 different optical filters partially overlaps in wavelength with another transmission function of another optical filter of the 10 different optical filters.

3. The spectral sensor of claim 2, wherein a partial overlap of two of the transmission functions comprises a crossing of the two transmission functions at a value no less than 10% of peak values of the two transmission functions.

4. The spectral sensor of claim 2, wherein the full-width half-maximum value of each transmission function is no larger than 0.5 microns.

5. The spectral sensor of claim 1, wherein the first substrate and the second substrate are a same substrate.

6. The spectral sensor of claim 1, wherein the 10 different optical filters each have a transmission function with a peak value in a range between 8 microns and 12 microns.

7. The spectral sensor of claim 1, wherein at least one optical filter in the array of optical filters is in optical communication with more than one detector in the array of LWIR detectors.

8. The spectral sensor of claim 1, wherein the array of optical filters includes at least two optical filters that have a same transmission function or a same reflectivity function and the 10 different optical filters are located randomly in the array of optical filters.

9. The spectral sensor of claim 1, wherein the optical element comprises a random phase plate, a diffusor, a fly's-eye lens, micro lenses, prismatic sheets, or some combination thereof.

10. The spectral sensor of claim 1, wherein the same layer of material is formed from germanium.

11. The spectral sensor of claim 1, wherein the first mirror is a multilayer Bragg mirror.

12. A method of making a spectral sensor, the method comprising:

illuminating a grayscale photomask to expose a photoresist and pattern an array of etalon cavities for Fabry-Pèrot filters, wherein the photoresist is deposited over an etalon layer on a substrate;

developing the photoresist such that the photoresist has at least 10 different thicknesses over the etalon layer;

etching the photoresist and at least a portion of the etalon layer to pattern the array of etalon cavities, wherein the array of etalon cavities includes at least 10 etalon cavities having different thicknesses;

forming an array of the Fabry-Perot filters from the array of etalons;

disposing the array of Fabry-Perot filters adjacent to an array of LWIR detectors;

disposing an optical element between a field-of-view of the spectral sensor and the array of etalon cavities, wherein the optical element homogenizes emissions from the field-of-view across all of an array of LWIR detectors for the spectral sensor and eliminates a spatial dependence of the field-of-view in a spectral domain for the spectral sensor such that the array of LWIR detectors does not image the field-of-view; and assembling the optical element, the array of Fabry-Perot filters, and the array of LWIR detectors in a package without Peltier cooling, the package having a size and weight to mount on an unmanned aerial vehicle weighing less than 20 pounds and to be flown by the unmanned aerial vehicle.

13. The method of claim 12, wherein the etching is a single processing step that etches both the photoresist and the etalon layer.

14. The method of claim 12, further comprising:

depositing a mirror over the array of etalon cavities to form the array of Fabry-Perot filters that comprises 10 different optical filters, wherein the 10 different optical filters each have a transmission function with a peak transmission wavelength and a full-width half-maximum value of the transmission function;

the peak transmission wavelengths of the 10 different optical filters are different from each other by a value that is at least 10% of the full-width half-maximum value; and each transmission function of the 10 different optical filters partially overlaps in wavelength with another transmission function of another optical filter of the 10 different optical filters.

15. The method of claim 14, further comprising:

optically coupling the array of Fabry-Perot filters to the array of LWIR detectors.

* * * * *